United States Patent [19]
Yamauchi et al.

[11] Patent Number: 5,481,497
[45] Date of Patent: Jan. 2, 1996

[54] SEMICONDUCTOR MEMORY DEVICE PROVIDING EXTERNAL OUTPUT DATA SIGNAL IN ACCORDANCE WITH STATES OF TRUE AND COMPLEMENTARY READ BUSES

[75] Inventors: Tadaaki Yamauchi; Hiroshi Miyamoto; Yoshikazu Morooka; Kiyohiro Furutani; Makiko Aoki, all of Hyogo, Japan

[73] Assignee: Mitsubishi Denki Kabushiki Kaisha, Tokyo, Japan

[21] Appl. No.: 304,749

[22] Filed: Sep. 12, 1994

[30] Foreign Application Priority Data

Sep. 13, 1993 [JP] Japan .................................. 5-227449
May 20, 1994 [JP] Japan .................................. 6-106882

[51] Int. Cl.⁶ .................................................... G11C 7/00
[52] U.S. Cl. .................... 365/189.05; 365/205; 365/207; 365/208
[58] Field of Search ........................... 365/189.05, 190, 365/205, 207, 208

[56] References Cited

U.S. PATENT DOCUMENTS

| | | | |
|---|---|---|---|
| 5,088,065 | 2/1992 | Hanamura | 365/208 |
| 5,146,427 | 9/1992 | Sasaki | 365/189.05 |
| 5,233,558 | 8/1993 | Fujii | 365/207 X |
| 5,311,471 | 5/1994 | Matsumoto | 365/189.05 |

FOREIGN PATENT DOCUMENTS 63-102093  5/1988  Japan .
4-353698  12/1992  Japan .

OTHER PUBLICATIONS

"A 34-ns 1-Mbit CMOS SRAM Using Triple Polysilicon", WADA et al., IEEE Journal of Solid-State Circuits, vol. SC-22, No. 5, Oct. 1987, pp. 727-732.

"A 33-ns 64-Mb DRAM", Oowaki et al., IEEE Journal of Solid-State Circuits, vol. 26, No. 11, Nov. 1991, pp. 1498-1505.

Primary Examiner—David C. Nelms
Assistant Examiner—Son Mai
Attorney, Agent, or Firm—Lowe, Price, LeBlanc & Becker

[57] ABSTRACT

Read data supplied from one of a plurality of differential amplifier circuits is transmitted to a read data bus driver circuit via one of a plurality of CMOS transfer gates and a data latch circuit. The potential of read data bus pair is forcedly set to a low level in response to a control signal until the read data is transmitted to the read data bus driver circuit. Thereafter, the read data bus driver circuit drives the read data bus pair in accordance with the transmitted read data. Thereby, a speed of the address access operation can be increased without outputting invalid data.

17 Claims, 27 Drawing Sheets

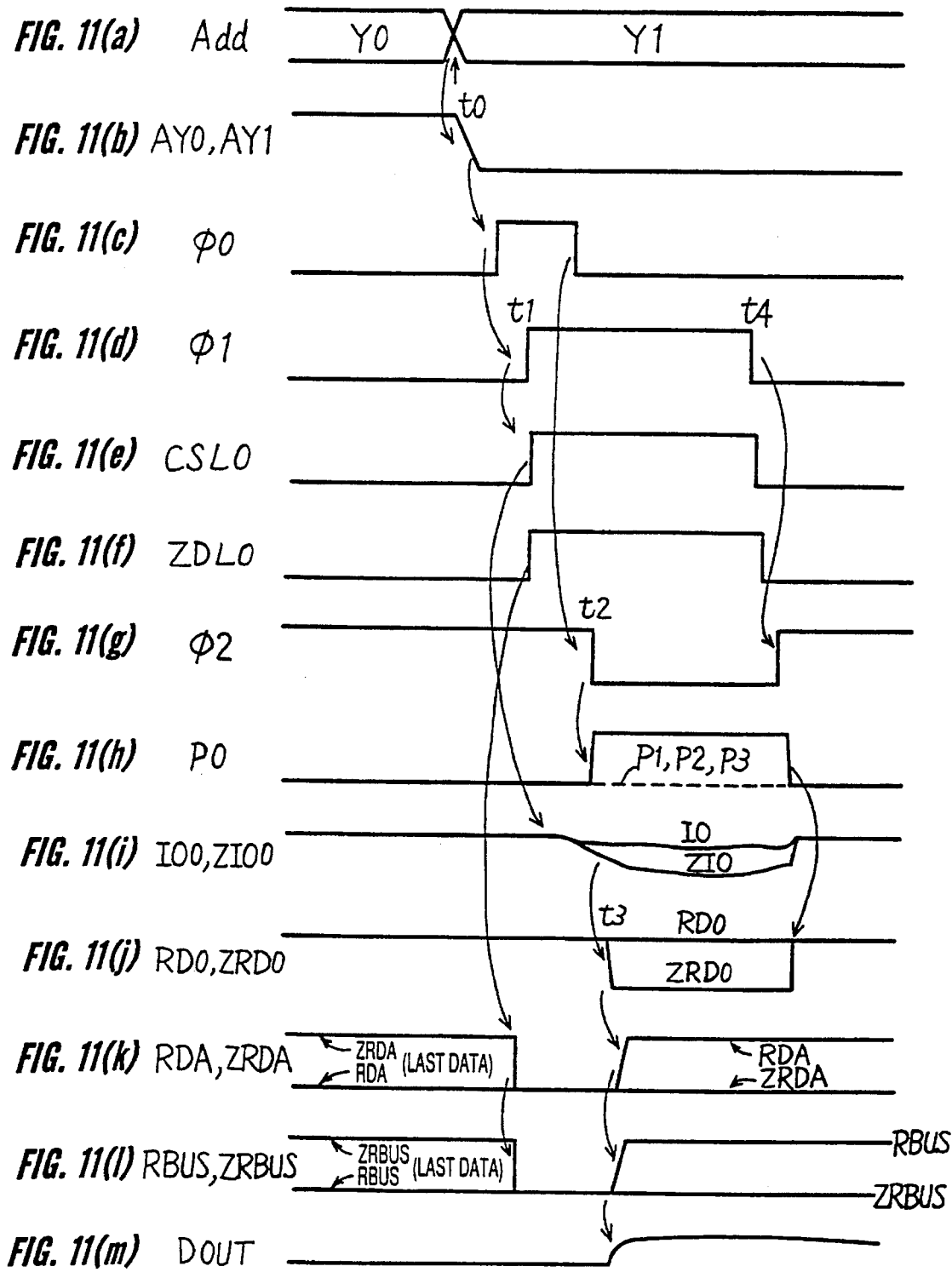

FIG. 12(a) Ext. ZCAS
FIG. 12(b) Ext. ZOE
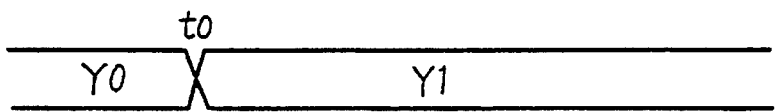
FIG. 12(c) Add
FIG. 12(d) φ0
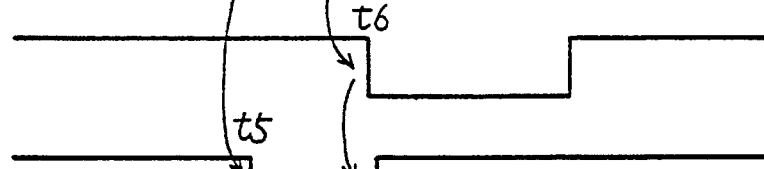
FIG. 12(e) φ2
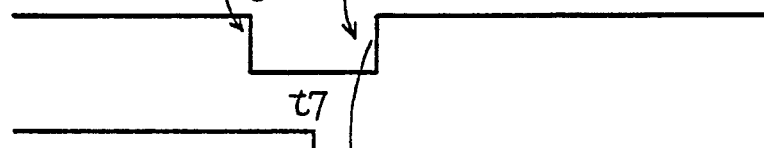
FIG. 12(f) φ4
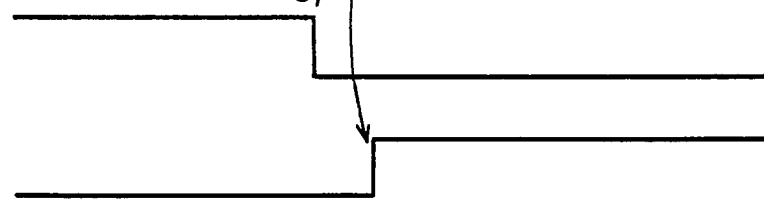
FIG. 12(g) ZCASD
FIG. 12(h) OEM
FIG. 12(i) RBUS, ZRBUS
FIG. 12(j) DOUT

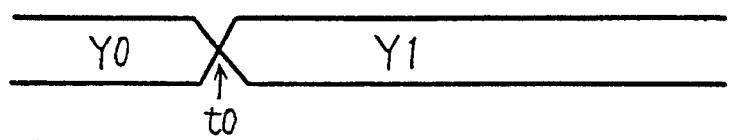
FIG. 15(a) Add
FIG. 15(b) AY0,AY1
FIG. 15(c) φ0
FIG. 15(d) φ1
FIG. 15(e) CSL0
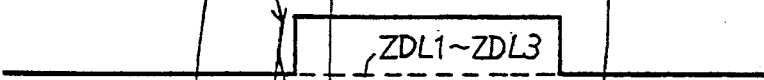
FIG. 15(f) ZDL0
FIG. 15(g) φ2
FIG. 15(h) P0
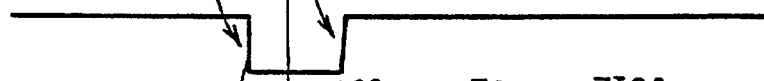
FIG. 15(i) φ3
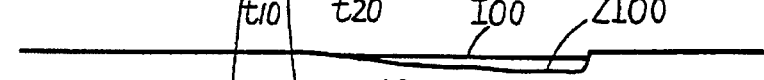
FIG. 15(j) IO0,ZIO0
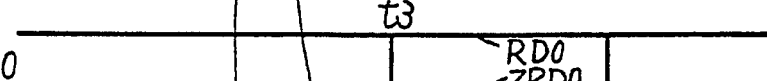
FIG. 15(k) RD0,ZRD0
FIG. 15(l) RDA,ZRDA
FIG. 15(m) RBUS,ZRBUS

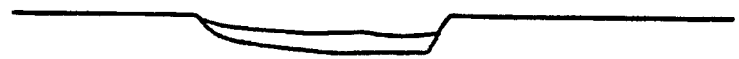
FIG. 19(a) I00, ZI00
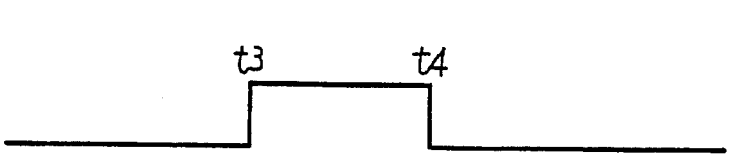
FIG. 19(b) P0
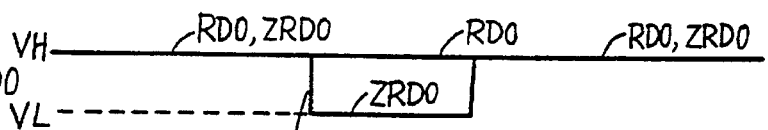
FIG. 19(c) RD0, ZRD0
FIG. 19(d) φ1
FIG. 19(e) RDA, ZRDA
FIG. 19(f) RBUS, ZRBUS
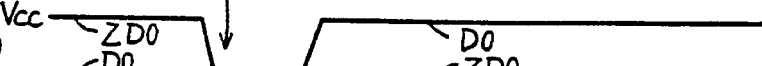
FIG. 19(g) D0, ZD0
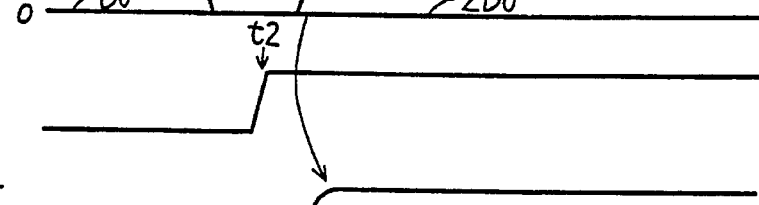
FIG. 19(h) OEM
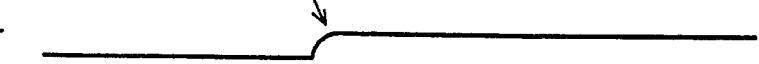
FIG. 19(i) DOUT

FIG. 30(a) PRIOR ART  Ext. ZCAS
FIG. 30(b) PRIOR ART  Ext. ZOE
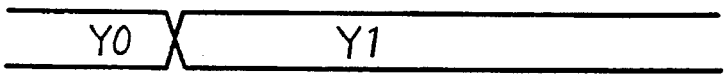
FIG. 30(c) PRIOR ART  Add
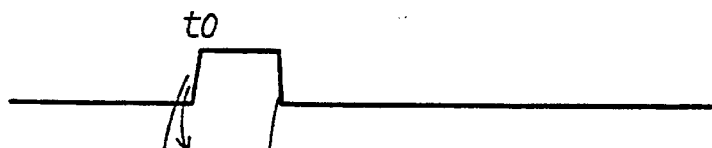
FIG. 30(d) PRIOR ART  φ0
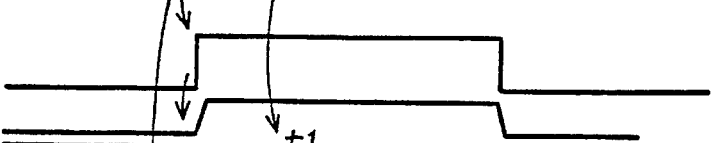
FIG. 30(e) PRIOR ART  φ1
FIG. 30(f) PRIOR ART  CSL
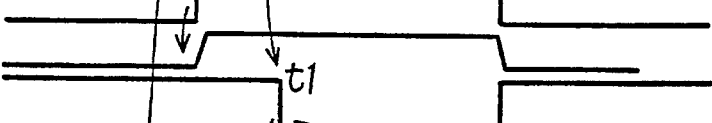
FIG. 30(g) PRIOR ART  φ2
FIG. 30(h) PRIOR ART  RD
FIG. 30(i) PRIOR ART  ZRDA
FIG. 30(j) PRIOR ART  ZRBUS
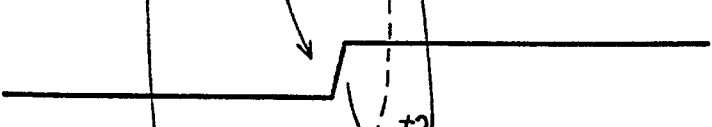
FIG. 30(k) PRIOR ART  OD, ZOD
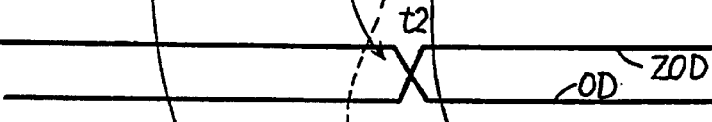
FIG. 30(l) PRIOR ART  φ3
FIG. 30(m) PRIOR ART  φ4
FIG. 30(n) PRIOR ART  φ5
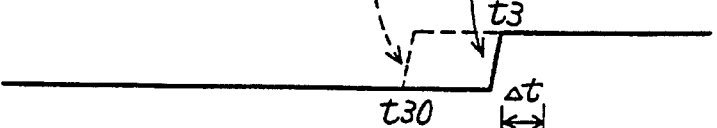
FIG. 30(o) PRIOR ART  DOUT

SEMICONDUCTOR MEMORY DEVICE PROVIDING EXTERNAL OUTPUT DATA SIGNAL IN ACCORDANCE WITH STATES OF TRUE AND COMPLEMENTARY READ BUSES

BACKGROUND OF THE INVENTION

1. Field of the Invention

The present invention relates to a semiconductor memory device, and in particular to a semiconductor memory device which amplifies a signal read from a memory cell and outputs the same from an output buffer.

2. Description of the Related Art

FIG. 29 is a circuit diagram showing a data read circuit in a conventional semiconductor memory device. The data read circuit includes a control signal generating circuits 930 and 935, a memory cell array portion 200, a row decoder 901, a column decoder 900, an I/O line pair IO and ZIO, a differential amplifier 910, a selector circuit 915, a data latch circuit 920, a read data bus driver circuit 925, a read data bus ZRBUS, inverters 1001 and 1002, an output buffer 47 and an external output terminal DOUT.

Control signal generating circuit 935 includes an address buffer 936, an address change detecting circuit 937, an S-R flip-flop 938, a delay circuit 939, inverters 702 and 704, a NAND gate 703, a delay circuit 940 and an S-R flip-flop 941.

Control signal generating circuit 930 includes a delay circuit 945, NOR gate 710, NAND gates 705 and 706, and inverters 707, 708, 709 and 710.

Memory cell array part 200 includes word lines WL, bit line pairs BL and ZBL, memory cells 711, sense amplifiers 902, and NMOS transistors 720 and 721. Each memory cell 711 includes a memory cell capacitor 903 and a memory cell transistor 710.

Selector circuit 915 includes a PMOS transistor 712, an NMOS transistor 713 and an inverter 714. The selector circuit 915 forms a CMOS transfer gate. Data latch circuit 920 includes inverters 715 and 717 as well as a clocked inverter 716. Read data bus driver circuit 925 includes inverters 718 and 719. Read data bus ZRBUS extends between memory cell array portion 200 and output buffer 47.

Control signal generating circuit 935 receives on its address buffer 936 an external address signal Add. Control signal generating circuit 935 generates the following signals based on the external address signal Add. Address change detecting circuit 937 generates a signal $\phi 0$. S-R flip-flop 938 generates a signal $\phi 1$. NAND gate 703 generates a signal $\phi 2$. S-R flip-flop 941 generates a signal $\phi 3$.

Control signal generating circuit 930 receives signals as follows. Delay circuit 945 receives an external column address signal Ext.ZCAS. Inverter 708 receives an external output enable signal Ext.ZOE. Inverter 707 receives a signal $\phi 3$. Control signal generating circuit 930 generates a signal $\phi 5$ from inverter 710 based on the received signals.

Row decoder 901 selects word line WL. Column decoder 900 receives signal $\phi 1$ and selects a column select line CSL. Differential amplifier 910 amplifies a potential difference of I/O line pair IO and ZIO to generate a resultant output signal RD.

In selector circuit 915, transistor 712 receives signal $\phi 2$, and transistor 713 receives signal $\phi 2$ inverted by inverter 714. Selector circuit 915 applies signal RD to data latch circuit 920 in response to signal $\phi 2$.

In data latch circuit 920, inverter 715 receives output signals from selector circuit 915 and clocked inverter 716 to generate a signal ZRDA. In data latch circuit 920, clocked inverter 716 receives signal $\phi 2$ and an inverted signal of the same, and latches signal ZRDA in response to the received signals.

Read data bus driver circuit 925 is responsive to signal ZRDA to drive read data bus ZRBUS. Inverters 1001 and 1002 generate signals OD and ZOD in accordance with the data on read data bus ZRBUS, respectively. Output buffer 47 receives signals $\phi 5$, OD and ZOD, and outputs external output data signal DOUT from external output terminal DOUT in response to the received signals.

Now, the operation of the read circuit in FIG. 29 will be described below. FIG. 30 is a timing chart showing the operation of the read circuit in FIG. 29.

Description will be given on the case where external signals Ext.ZCAS and Ext.ZOE change their levels from high to low, so that data Y1 in external address signal Add is accessed.

Owing to change of data in external address signal Add from Y0 to Y1, a pulse generates at time t0 in signal $\phi 0$ supplied from address change detecting circuit 937. At this time, S-R flip-flop 938 is set, so that signal $\phi 1$ becomes high.

As a result, column decoder 900 selects column select line CSL. Thereby, data read from memory cell 711 is transmitted to I/O line pair IO and ZIO via bit line pair BL and ZBL. Therefore, a potential difference generates between I/O lines IO and ZIO.

Then, upon reception of signal $\phi 0$, signal $\phi 2$ becomes low at time t1. Thereby, differential amplifier 910 is activated, and selector circuit 915 becomes conductive. Owing to the fact that selector circuit 915 becomes conductive, data latch circuit 920 outputs signal ZRDA in response to signal RD supplied from differential amplifier 910.

In response to signal ZRDA, read data bus driver circuit 925 drives read data bus ZRBUS. In response to data on read data bus ZRBUS thus driven, inverters 1001 and 1002 generate signals OD and ZOD at time t2, respectively. These signals OD and ZOD are transmitted to output buffer 47. In output buffer 47, signal $\phi 5$ becomes high at time t3 after transmission of signals OD and ZOD, and at the same time, output buffer 47 starts its operation for supplying external output data signal DOUT.

It is assumed that signal $\phi 5$ which activates output buffer 47 becomes high at time t30 preceding time t2. In this case, output buffer 47 starts its operation before time t2 at which data read from memory cell 711 is transmitted to output buffer 47. Therefore, output buffer 47 once outputs the high level of signal RD, which is supplied during a standby state of differential amplifier 910, as data read from memory cell 711.

In the aforementioned case, invalid data (high level) opposite to true data (low level) is once output as external output data signal DOUT. Therefore, such a disadvantage generates that the time at which external output signal DOUT became the true data (low level) is delayed by $\Delta t$ from the time during the normal operation. In order to overcome the above disadvantage, timing at which output buffer 47 starts its operation must be delayed until the signal sent from differential amplifier 910 reaches output buffer 47.

In a memory of a large capacity, however, a long signal transmission time of read data bus ZRBUS increases in accordance with increase of sizes of a chip, so that a long time is required until the output signal of differential amplifier 910 reaches output buffer 47. Therefore, the timing at which output buffer 47 is activated must be determined taking the variation of performance of transistors, which are interposed between differential amplifier 910 and output buffer 47, into consideration, and by this reason, the timing at which signal φ5 becomes high must be delayed further.

However, if the signal φ5 does not become high, external output data signal DOUT is not output even if the output signal of differential amplifier 910 reaches output buffer 47. Therefore, if the timing at which signal φ5 becomes high is delayed excessively, the access is also delayed excessively, although the invalid data is not output.

As described above, the read circuit in the conventional semiconductor memory device requires a sufficient margin in connection with the timing of operation of the output buffer in order to prevent output of invalid data during the data read operation. This restricts the speed of the address access operation.

Further, the operation timing of the output buffer is determined by the delay circuit included in the control signal generating circuit, so that it is impossible to output the external output signal at the same timing as the reading of data onto the data bus during the address access operation, resulting in a low speed of the data read operation.

SUMMARY OF THE INVENTION

An object of the invention is to provide a semiconductor memory device which can perform an address access operation at a high speed.

Another object of the invention is to provide a semiconductor memory device which can perform an address access operation at a high speed without outputting invalid data.

Still another object of the invention is to provide a semiconductor memory device of which current consumption during address access is reduced.

A semiconductor memory device according to the invention includes a memory cell array, a plurality of I/O line pairs, a plurality of differential amplifier circuits, a first data line, a second data line, a first drive circuit, a second drive circuit, an output buffer circuit and a control circuit.

The memory cell array includes a plurality of word lines, a plurality of bit line pairs crossing the plurality of word lines, and a plurality of memory cells connected to the word lines and bit line pairs. The I/O line pairs are connected to the respective bit line pairs via switching circuits.

The plurality of differential amplifier circuits are provided correspondingly to the plurality of I/O line pairs, respectively, are selectively operated, and each amplify a potential difference of the corresponding I/O line pair for outputting the same. The first and second data lines complementarily transmit an output signal of the selected differential amplifier circuit.

The first drive circuit receives the output signal of the selected differential amplifier circuit, and transmits a signal having the same phase as the received output signal to the first data line in response to the received output signal.

The second drive circuit receives a signal having a phase opposite to that of the output signal of the selected differential amplifier circuit, and responds to the received signal by transmitting a signal, which has the phase opposite to that of the output signal of the selected differential amplifier circuit, to the second data line.

The output buffer circuit receives signals from the first and second data lines, and is controlled to attain a high impedance state or a signal output state in response to the potentials of the received signals.

The control circuit controls the first and second drive circuits such that the first and second data lines have the potentials which set the output buffer circuit to the high impedance state prior to the operation of the selected differential amplifier circuit.

As described above, data is read onto the bit line pair from the memory cell in the memory cell array. The read data is transmitted from the bit line pair to the I/O line pair. The potential difference of the I/O line pair is amplified by the differential amplifier circuit corresponding to the I/O line pair. The output signals of the differential amplifier circuit are transmitted to the first and second data lines by the first and second drive circuits, respectively. The output signals transmitted to the first and second data lines are complementary to each other.

In the above case where the differential amplifier circuit operates as described above, and the complementary signals are transmitted to the first and second data lines, the output buffer circuit attains the signal output state.

Prior to the operation of the differential amplifier circuit, the control circuit sets the potentials of the first and second data lines to the levels which set the output buffer circuit to the high impedance state. Thus, the signals transmitted to the first and second data lines are not complementary to each other.

Therefore, owing to the fact that the first and second drive circuits are controlled prior to the operation of the selected differential amplifier circuit, the output buffer circuit attains the high impedance state, preventing output of invalid data.

Since the operation of the output buffer circuit is controlled by the first and second drive circuits arranged upstream of the output buffer circuit, it is possible to reduce a time by which the operation of the first and second drive circuits is delayed taking delay of the output signal of the differential amplifier circuit into consideration. Therefore, a speed of the address access operation can be increased.

A semiconductor memory device according to another aspect of the invention includes a memory cell array, a plurality of I/O line pairs, a plurality of differential amplifier circuits, a first data line, a second data line, a first drive circuit, a second drive circuit, and an output buffer circuit.

The memory cell array includes a plurality of word lines, a plurality of bit line pairs crossing the plurality of word lines, and a plurality of memory cells connected to the word lines and bit line pairs. The plurality of I/O line pairs are connected to the plurality of bit line pairs via switching circuits.

The plurality of differential amplifier circuits are provided correspondingly to the plurality of I/O line pairs, respectively, are selectively operated, and each amplify a potential difference of the corresponding I/O line pair to output, as a result of the amplification, first and second output signals which are complementary to each other.

The first data line transmits the first output signal of the selected differential amplifier circuit. The second data line transmits the second output signal of the selected differential amplifier circuit.

The first drive circuit transmits the first output signal of the selected differential amplifier circuit to the first data line. The second drive circuit transmits the second output signal of the selected differential amplifier circuit to the second data line.

The output buffer circuit receives the signals from the first and second data lines, and is controlled in response to potentials of the received signals to attain a high impedance state or a signal output state.

Further, the first and second drive circuits transmit signals of potentials, which set the output buffer circuit to the high impedance state, to the first and second data lines prior to the operation of the selected differential amplifier circuit.

As described above, data is read onto the bit line pair from a memory cell in the memory cell array. The read data is transmitted from the bit line pair to the I/O line pair. The potential difference of the I/O line pair is amplified by the differential amplifier circuit corresponding to the I/O line pair. The differential amplifier circuit outputs the first and second output signals which are complementary to each other. The first and second output signals are transmitted onto the first and second data lines by the first and second drive circuit, respectively.

When the differential amplifier circuit operates as described above, and the complementary signals are transmitted onto the first and second data lines, the output buffer circuit attains the signal output state.

Prior to the operation of the differential amplifier circuit, the first and second drive circuit set the output signal sent from the differential amplifier circuit to have the potentials, which set the output buffer circuit to the high impedance state, and transmit the same to the first and second data lines, respectively. Thus, the signals transmitted to the first and second data lines are not complementary to each other.

With respect to the structure of the device, a signal path from the I/O line pair to the output buffer circuit is of a completely complementary type. Therefore, the first and second drive circuits and the output buffer circuit can be operated at an appropriate timing without waiting for arrival of correct read data sent from the differential amplifier circuit at the first and second drive circuits and the output buffer circuit. Accordingly, the access time for reading data from the memory cell can be reduced, and output of invalid data can be prevented.

A semiconductor memory device according to still another aspect of the invention includes, similarly to the semiconductor memory device already described, a memory cell array, a plurality of I/O line pairs, a plurality of differential amplifier circuits, a first data line, a second data line, a first drive circuit, a second drive circuit, and an output buffer circuit, and further includes the following structural features.

Each of first and second output signals supplied from the differential amplifier circuit is maintained at a high level in a first potential or a low level in a second potential, and there is further provided a level shifting circuit for shifting each potential of the first and second data lines and supplying each shifted potential to the output buffer circuit.

The level shifting circuit shifts each potential of the first and second data lines, such that the first potential is shifted to a third potential higher than the first potential, and a second potential is shifted to a fourth potential lower than the second potential.

The output buffer circuit has its state controlled in response to the potentials supplied from the level shifting circuits.

As described above, the signals supplied from the differential amplifier circuits to the output buffer circuit via the first and second data lines are processed to shift their levels by the level shifting circuit.

The level shifting circuit shifts each potential of the first and second data lines, such that the first potential at a high level is shifted to a third potential higher than the first potential, and the second potential at a low level is shifted to a fourth potential lower than the second potential.

The output buffer circuit is controlled to attain an appropriate state in response to the third and fourth potentials supplied from the level shifting circuit. Therefore, the amplitudes of the potentials of the first and second output signals can be reduced appropriately in the path from the differential amplifier circuit to the level shifting circuit. Owing to this reduction of the amplitudes, it is possible to reduce the amounts of electric charges for charge and discharge of each of the first and second data lines in the signal transmitting operation.

As a result, a signal transmission speed can be increased, and further, current consumption at the first and second data lines can be reduced.

A semiconductor memory device according to further another aspect of the invention includes, similarly to the semiconductor memory device already described, a memory cell array, a plurality of I/O line pairs, a plurality of differential amplifier circuits, a first data line, a second data line, a first drive circuit, a second drive circuit, and an output buffer circuit, and further includes the following structural features.

Each of the differential amplifier circuits is provided correspondingly to two I/O line pairs among the plurality of I/O line pairs, and includes two differential amplifier elements each having a pair of input terminals and one output terminal. There are further provided a plurality of switch circuits and a logic circuit.

Each switch circuit is provided correspondingly to two I/O line pairs, and changes a state of connection between the two I/O line pairs and the two differential amplifier elements in the corresponding differential amplifier circuit in accordance with the operation mode. More specifically, each switch circuit connects, in a normal operation mode, one of the corresponding two I/O line pairs to each of the two differential amplifier elements and, in a test mode, connects the corresponding two I/O line pairs to the two differential amplifier elements in the one-to-one relationship.

In the test mode, the logic circuit outputs a signal indicative of a test result based on the output signals of the respective differential amplifier circuits.

As described above, the switch circuit operates, in the normal operation mode, to connect one of the two I/O line pairs to each of the two differential amplifier elements. In the test mode, it connects the two I/O line pairs to the two differential amplifier elements in one-to-one corresponding relationship.

Therefore, in the normal operation mode, the differential amplifier circuit can output complementary signals. In the test mode, each differential amplifier element outputs a signal corresponding to each I/O line pair. In the test mode, the logic circuit can output the signal indicative of the test result based on the signals supplied from the respective differential amplifier elements.

Since the two I/O line pairs can commonly use the differential amplifier circuits as described above, the address access operation can be performed at a high speed, and also the number of elements for the differential amplifier circuits can be reduced. Further, test of the circuitry can be performed in spite of the fact that the number of the elements of the differential amplifier circuits is reduced.

A semiconductor memory device of yet another aspect of the invention includes a memory cell array, a plurality of I/O line pairs and a plurality of differential amplifier circuits, wherein each of the differential amplifier circuits includes a CMOS differential amplifier circuit, and each CMOS differential amplifier circuit includes first, second, third and fourth drive MOS transistors of a first conductivity type, and first, second, third, fourth, fifth and sixth load MOS transistors of a second conductivity type.

The memory cell array includes a plurality of word lines, a plurality of bit line pairs crossing the plurality of word lines, and a plurality of memory cells connected to the word lines and the bit line pairs. The I/O line pairs are connected to the respective bit line pairs via switching circuits.

The plurality of differential amplifier circuits are provided correspondingly to the plurality of I/O line pairs, respectively, are selectively operated, and each amplify the potential difference of the I/O line pair for outputting the same.

As described above, data is read onto the bit line pair from the memory cell in the memory cell array. The read data is transmitted from the bit line pair to the I/O line pair. The potential difference of the I/O line pair is amplified by the differential amplifier circuit corresponding to the I/O line pair.

In each of the differential amplifier circuits, the first drive MOS transistor receives on its gate a first input signal supplied from one I/O line in the corresponding I/O line pair. The second MOS transistor receives on its gate a second input signal supplied from the other I/O line in the corresponding I/O line pair.

Each of the first and second load MOS transistors has a drain connected to a drain of the first drive MOS transistor. Each of the third and fourth load MOS transistors has a drain connected to a drain of the second drive MOS transistor.

The third drive MOS transistor receives on its gate the second input signal. The fifth load MOS transistor has a drain connected to a drain of the third drive MOS transistor.

The fourth MOS transistor receives on its gate the first input signal. The sixth load MOS transistor has a drain connected to a drain of the fourth drive MOS transistor.

Further, a gate of each of the first, third and fifth load transistors is connected to the drain of the first drive MOS transistor, and a gate of each of the second, fourth and sixth load MOS transistors is connected to the drain of the second drive MOS transistor.

A first output signal is supplied from a connection node of the drains of the third drive MOS transistor and the fifth load MOS transistor. A second output signal is supplied from a connection node of the drains of the fourth load MOS transistor and the sixth load MOS transistor.

In the operation of each differential amplifier circuit, the first and fourth drive MOS transistors receive on their gates the first input signal, and the second and third drive MOS transistors receive on their gates the second input signal. Therefore, the first and fourth drive MOS transistors are turn on and off in a manner similar to each other, and the second and third drive MOS transistors are turned on and off in a manner similar to each other.

The third and fifth load MOS transistors are turned on and off in a manner similar to each other in response to the potential of the drain of the first drive MOS transistor. The second and sixth load MOS transistors are turned on and off in a manner similar to each other in response to the potential of the drain of the second drive MOS transistor.

The second and third load MOS transistors are cross-coupled. Therefore, when the first or second drive MOS transistor is turned on, one of the second and third load MOS transistors is turned on and the other is turned off in response to the potential of the drain of the turned-on transistor.

Therefore, when the fourth drive MOS transistor is turned on in response to the first input signal, the fifth load MOS transistor is turned on. When the third drive MOS transistor is turned on in response to the second input signal, the sixth load MOS transistor is turned on. Thereby, the first output signal and the second output signal becomes complementary to each other.

When the levels of the first and second input signals changes, the following operation is performed. For example, when the level of the first input signal changes and thus the first and fourth drive MOS transistors are strongly turned on, the potentials of the drains of these transistors change with respect to the potentials at the normal state.

Thereby, there is a possibility that the potential of the second output signal changes. Owing to the fact that the second and third load MOS transistors are cross-coupled, when the potential of the drain of the first drive MOS transistor changes, the potential of the drain of the second drive MOS transistor changes oppositely. Thereby, the sixth load MOS transistor is weakly turned off.

Therefore, even if the fourth drive MOS transistor is strongly turned off, the sixth load MOS transistor is weakly turned off, so that variations of the potentials at the connection node between these transistors cancel each other. Accordingly, the level of the second output signal does not change even if the level of the first input signal changes. The same is true with respect to the relationship between each input signal and each output signal other than the above.

As described above, owing to the respective operations of the first to fourth drive MOS transistors and the first to sixth load MOS transistors, the level of the output signals can be maintained stably when the signals supplied from the I/O line pairs change with respect to the reference level.

Therefore, a large voltage gain can be ensured with respect to the change of level of the input signal. Since a larger voltage gain enables amplification of the input signal at a higher speed, the invention can reduce a through current during the differential amplification, and thus can reduce the current consumption.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a timing chart showing the operation of the data read circuit in FIG. 7;

FIG. 12 is a timing chart showing the operation of an output buffer shown in FIG. 7 as well as the operation of a circuit which generates a signal activating the output buffer;

FIG. 15 is a timing chart showing the operation of a data read circuit employing the read data bus driver circuit in FIG. 14;

FIG. 19 is a timing chart showing the operation of a data read circuit shown in FIG. 17;

FIG. 30 is a timing chart showing the operation of a data read circuit in FIG. 29.

DESCRIPTION OF THE PREFERRED EMBODIMENTS

Preferred embodiments of the invention will now be described below with reference to the drawings.

First Embodiment

Figure 1:
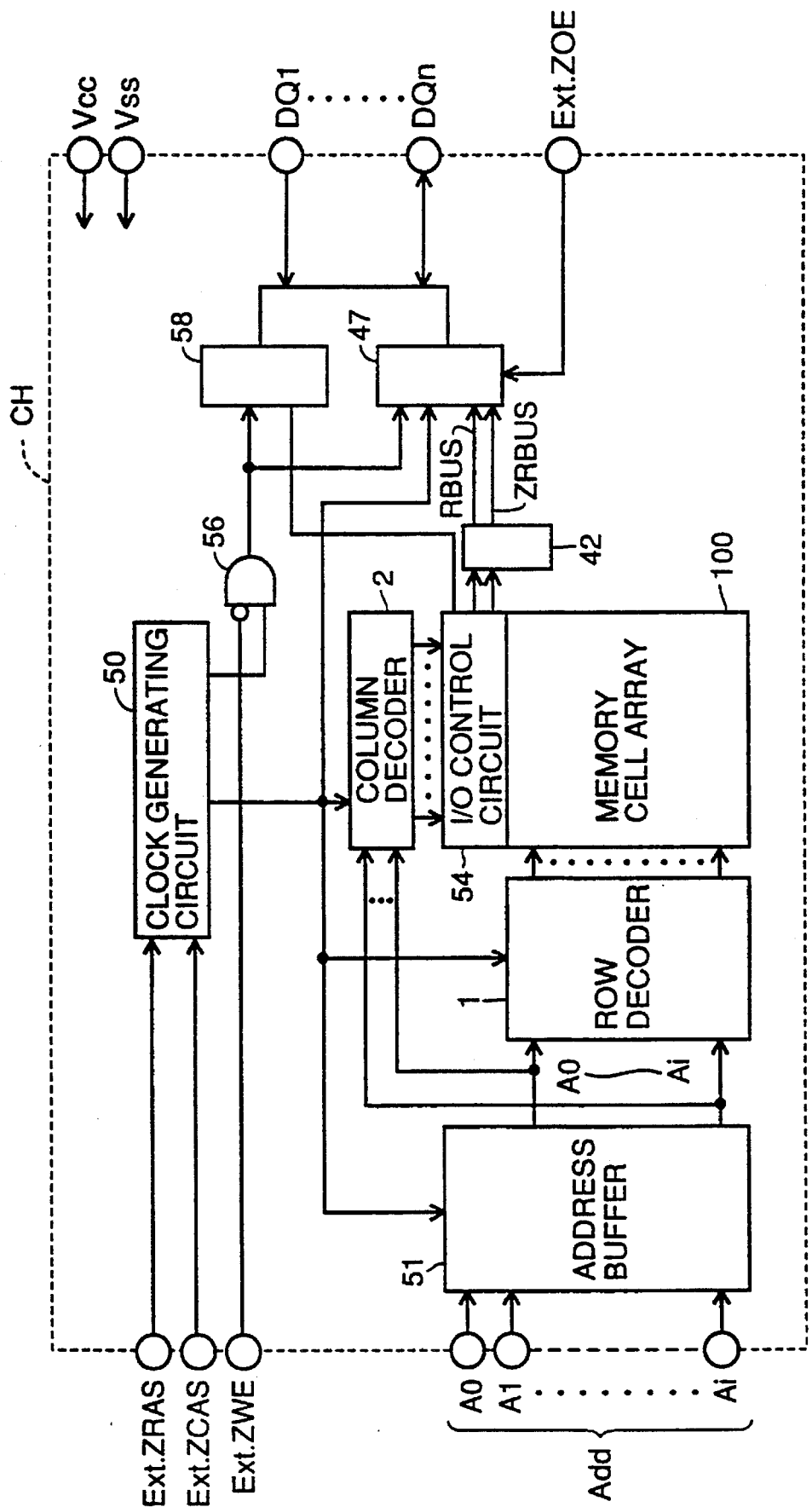
FIG. 1 is a block diagram showing a whole structure of a semiconductor memory device of a first embodiment.

FIG. 1 is a block diagram showing a whole structure of a semiconductor memory device of a first embodiment. The semiconductor memory device is formed on a semiconductor chip CH.

A memory cell array 100 includes a plurality of word lines, a plurality of bit lines crossing the plurality of word lines, and a plurality of memory cells connected to crossing points of these lines. A clock generating circuit 50 receives an external row address strobe signal Ext.ZRAS and an external column address strobe signal Ext.ZCAS, and generates an internal clock signal. An AND gate 56 receives the internal clock signal and an inverted signal of an external write enable signal Ext.ZWE, and generates an output signal.

This semiconductor memory device includes memory cell array 100, clock generating circuit 50 and AND gate 56 as well as an address buffer 51 row decoder 1, a column decoder 2, an input/output control circuit 54, a read data bus driver circuit 42, read data buses RBUS and ZRBUS, an input buffer 58 and an output buffer 47.

Address buffer 51 receives an external address signal Add including address signals A0, A1, . . . Ai, and generates internal address signals A0, A1, . . . Ai in response to the internal clock signal.

Row decoder 1 receives internal address signals A0, A1, . . . Ai, and selects one of the plurality of word lines provided in memory cell array 100 in response to the internal column signal. Column decoder 2 receives internal address signals A0–A1, and selects one of the plurality of column select lines provided in memory cell array 100 in response to the internal clock signal.

Data is read from the plurality of memory cells connected to the selected word line onto the corresponding bit line pairs, respectively. Data read onto the respective bit line pairs are amplified by sense amplifiers. Data is transmitted from the bit line pair, which corresponds to the column select line selected by column decoder 2, to I/O control circuit 54 via the corresponding I/O line pair.

In the write operation, input data supplied from data I/O terminals DQ1–DQn is applied to I/O control circuit 54 via input buffer 58. Input buffer 58 operates in accordance with a timing controlled by external write enable signal Ext.ZWE. In the read operation, data transmitted to I/O control circuit 54 is applied to output buffer 47 via read data bus driver circuit 42 and read data buses RBUS and ZRBUS.

Output buffer 47 also receives an output signal of AND gate 56, the internal clock signal and external output enable signal Ext.ZOE. In response to these signals, the external output signal is supplied from the output terminal among data I/O terminals DQ1–DQn.

Figure 2:
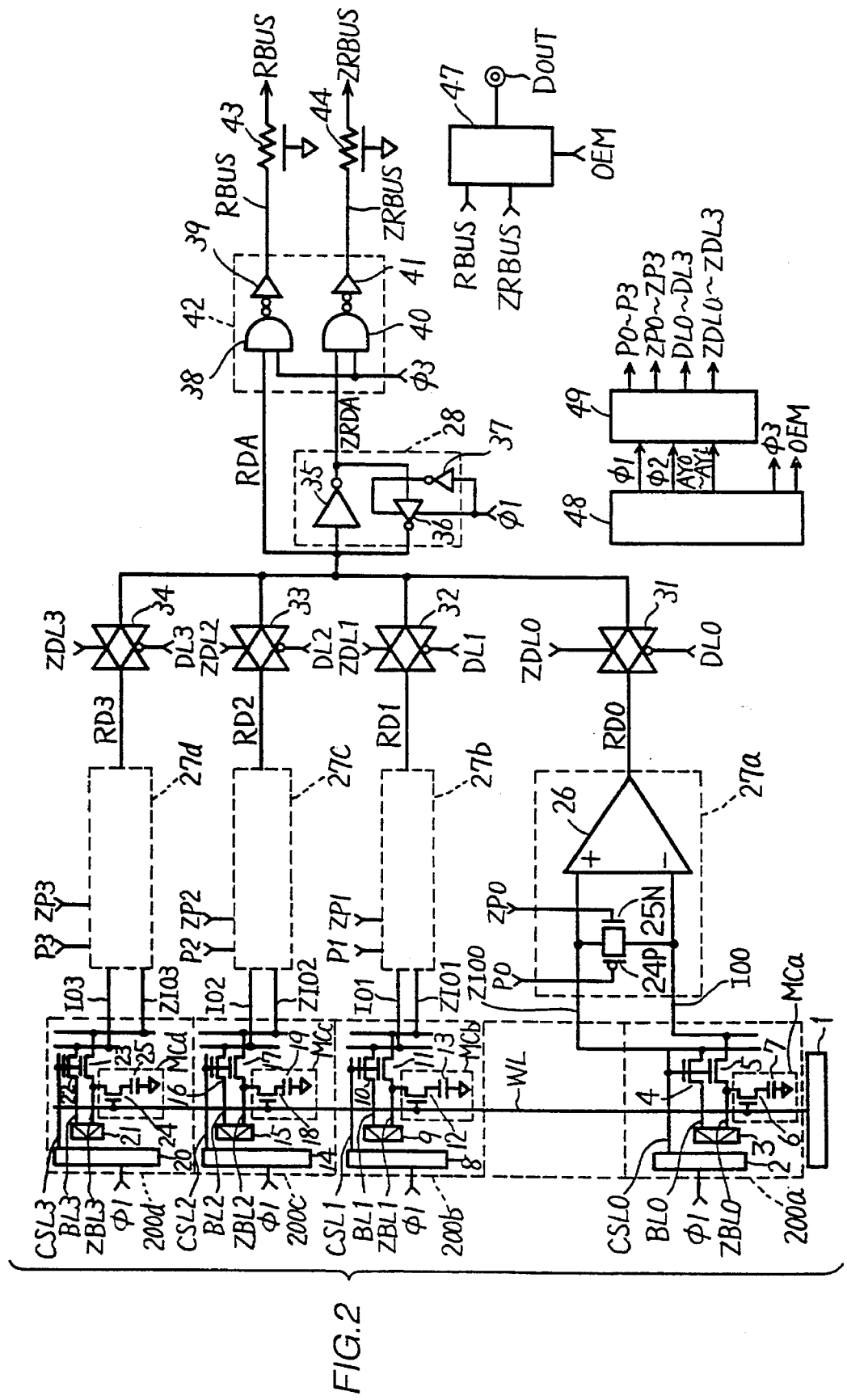
FIG. 2 is a circuit diagram showing a data read circuit provided between a memory cell array and an output buffer in the semiconductor memory device of the first embodiment.

Now, description in greater detail will be given on a circuit forming of a signal path between an end of memory cell array 100 and output buffer 47. FIG. 2 is a circuit diagram of a circuit (which will be referred to as a data read circuit) forming the signal path between memory cell array 100 and output buffer 47 in a semiconductor memory device of the first embodiment.

Referring to FIG. 2, in respective memory cell array portions 200a–200d, there are provided the bit line pairs, column decoders, column select lines and NMOS transistors corresponding to the memory cells MCa–MCd connected to one common word line WL.

Memory cell array portion 200a includes memory cell MCa, bit line pair BL0 and ZBL0, sense amplifier 3, column decoder 2, column select line CSL0 and NMOS transistors 4 and 5. Memory cell MCa includes memory cell transistor 6 and memory cell capacitor 7.

Memory cell array portion 200b includes memory cell MCb, bit line pair BL1 and ZBL1, sense amplifier 9, column decoder 8, column select line CSL1 and NMOS transistors 10 and 11. Memory cell MCb includes memory cell transistor 12 and memory cell capacitor 13.

Memory cell array portion 200c includes memory cell MCc, bit line pair BL2 and ZBL2, sense amplifier 15, column decoder 14, column select line CSL2 and NMOS transistors 16 and 17. Memory cell MCc includes memory cell transistor 18 and memory cell capacitor 19.

Memory cell array portion 200d includes memory cell MCd, bit line pair BL3 and ZBL3, sense amplifier 21, column decoder 20, column select line CSL3 and NMOS transistors 22 and 23. Memory cell MCd includes memory cell transistor 24 and memory cell capacitor 25.

Row decoder 1 selects word line WL. The word line WL is included in all the memory cell array portions 200a–200d.

I/O line pair IO0 and ZIO0 is connected to bit line pair BL0 and ZBL0 via transistors 4 and 5. I/O line pair IO1 and ZIO1 is connected to bit line pair BL1 and ZBL1 via transistors 10 and 11. I/O line pair IO2 and ZIO2 is connected to bit line pair BL2 and ZBL2 via transistors 16 and 17. I/O line pair IO3 and ZIO3 is connected to bit line pair BL3 and ZBL3 via transistors 22 and 23.

Differential amplifier circuit 27a includes a differential amplifier 26, and a transfer gate formed of a PMOS transistor 24P and an NMOS transistor 25N. Transistors 24P and 25N are provided for equalizing I/O line pair IO0 and ZIO0. At the inputs, differential amplifier 26 differentially amplifies the potential difference of the I/O line pair IO0 and ZIO0. Transistors 24P and 25N are connected between I/O lines IO0 and ZIO0. Transistor 24P receives on its gate a signal P0, and transistor 25N receives on its gate a signal ZP0.

Each of differential amplifier circuits 27b, 27c, 27d has the same structure as the differential amplifier circuit 27a, and includes a PMOS transistor and an NMOS transistor forming a transfer gate. Differential amplifier 27b receives signals P1 and ZP1, and differentially amplifies the potential difference of the I/O line pair IO1 and ZIO1. Differential amplifier 27c receives signals P2 and ZP2, and differentially amplifies the potential difference of the I/O line pair IO2 and ZIO2. Differential amplifier 27d receives signals P3 and ZP3, and differentially amplifies the potential difference of the I/O line pair IO3 and ZIO3.

A signal RD0 supplied from differential amplifier circuit 27a is applied to a CMOS transfer gate 31. A signal RD1 supplied from differential amplifier circuit 27b is applied to a CMOS transfer gate 32. A signal RD2 supplied from differential amplifier circuit 27c is applied to a CMOS transfer gate 33. A signal RD3 supplied from differential amplifier circuit 27d is applied to a CMOS transfer gate 34.

CMOS transfer gate 31 receives signals DL0 and ZDL0, and outputs the signal RD0 in response to the received signals. CMOS transfer gate 32 receives signals DL1 and ZDL1, and outputs the signal RD1 in response to the received signals. CMOS transfer gate 33 receives signals DL2 and ZDL2, and outputs the signal RD2 in response to the received signals. CMOS transfer gate 34 receives signals DL3 and ZDL3, and outputs the signal RD3 in response to the received signals.

CMOS transfer gates 31, 32, 33 and 34 operate in such a manner that only one of them becomes conductive. Thereby, signals RD0, RD1, RD2 and RD3 supplied from differential amplifier circuits 27a, 27b, 27 and 27d are selectively output.

The signal selectively supplied from CMOS transfer gate 31, 32, 33 or 34 is applied as a signal RDA to read data bus driver circuit 42. The signal selectively supplied from CMOS transfer gate 31, 32, 33 or 34 is also applied as a signal ZRDA to read data bus driver circuit 42 via a data latch circuit 28.

Data latch circuit 28 includes inverters 35 and 37 as well as a clocked inverter 36. Data latch circuit 28 inverts the supplied signal with inverter 35 and outputs signal ZRDA. Clocked inverter 36 receives a signal $\phi1$ and its inverted signal, and latches the data in response to the received signals.

Read data bus driver circuit 42 includes NAND gates 38 and 40 as well as inverters 39 and 41. NAND gate 38 and inverter 39 are connected together in serial. NAND gate 40 and inverter 41 are connected together in serial. NAND gate 38 receives signals RDA and $\phi3$. An output signal of NAND gate 38 is transmitted to read data bus RBUS via inverter 39. NAND gate 40 receives signals ZRDA and $\phi3$. An output signal of NAND gate 40 is transmitted to read data bus ZRBUS via inverter 41.

Read data bus RBUS has interconnection capacitance and resistance 43. Read data bus ZRBUS has interconnection capacitance and resistance 44. Signals transmitted from read data bus driver circuit 42 to read data buses RBUS and ZRBUS are transmitted to output buffer 47. Output buffer 47 receives a signal OEM, in addition to the signals sent from read data buses RBUS and ZRBUS. In response to these signals, output buffer 47 outputs external output data signal DOUT.

Control signal generating circuit 48 generates signals $\phi1$, $\phi2$, $\phi3$, AY0–AYi and OEM. Control signal generating circuit 49 receives signals $\phi1$, $\phi2$ and AY0–AYi and generates signals P0–P3, ZP0–ZP3, DL0–DL3 and ZDL0–ZDL3.

Differential amplifier circuits 27a–27d, CMOS transfer gates 31–34 and control signal generating circuit 49 are included in I/O control circuit 54 shown in FIG. 1. Data latch circuit 28 and control signal generating circuit 48 are disposed near I/O control circuit 54 and memory cell array 100.

In the read circuit in FIG. 2 described above, row decoder 1 selects word line WL, and column decoders 2, 8, 14, 10 select column select lines CSL0, CSL1, CSL2 and CSL3, respectively. Data read from memory cells MCa, MCb, MCc and MCd are amplified by sense amplifiers 8, 9, 15 and 21, respectively.

The data thus read and amplified are transmitted onto I/O line pairs IO0, ZIO0, IO1, ZIO1, IO2, ZIO2, IO3 and ZIO3. Among these four sets of data, only one set of data is amplified by one of differential amplifier circuits 27a–27d.

One of CMOS transfer gates 31–34, which corresponds to the differential amplifier circuit actually amplifying data, becomes conductive, and the output signal of this differential amplifier circuit is sent to output buffer 47 via data latch circuit 28, read data bus driver circuit 42 and read data buses RBUS and ZRBUS. Output buffer 47 outputs external output data signal DOUT.

Figure 3:
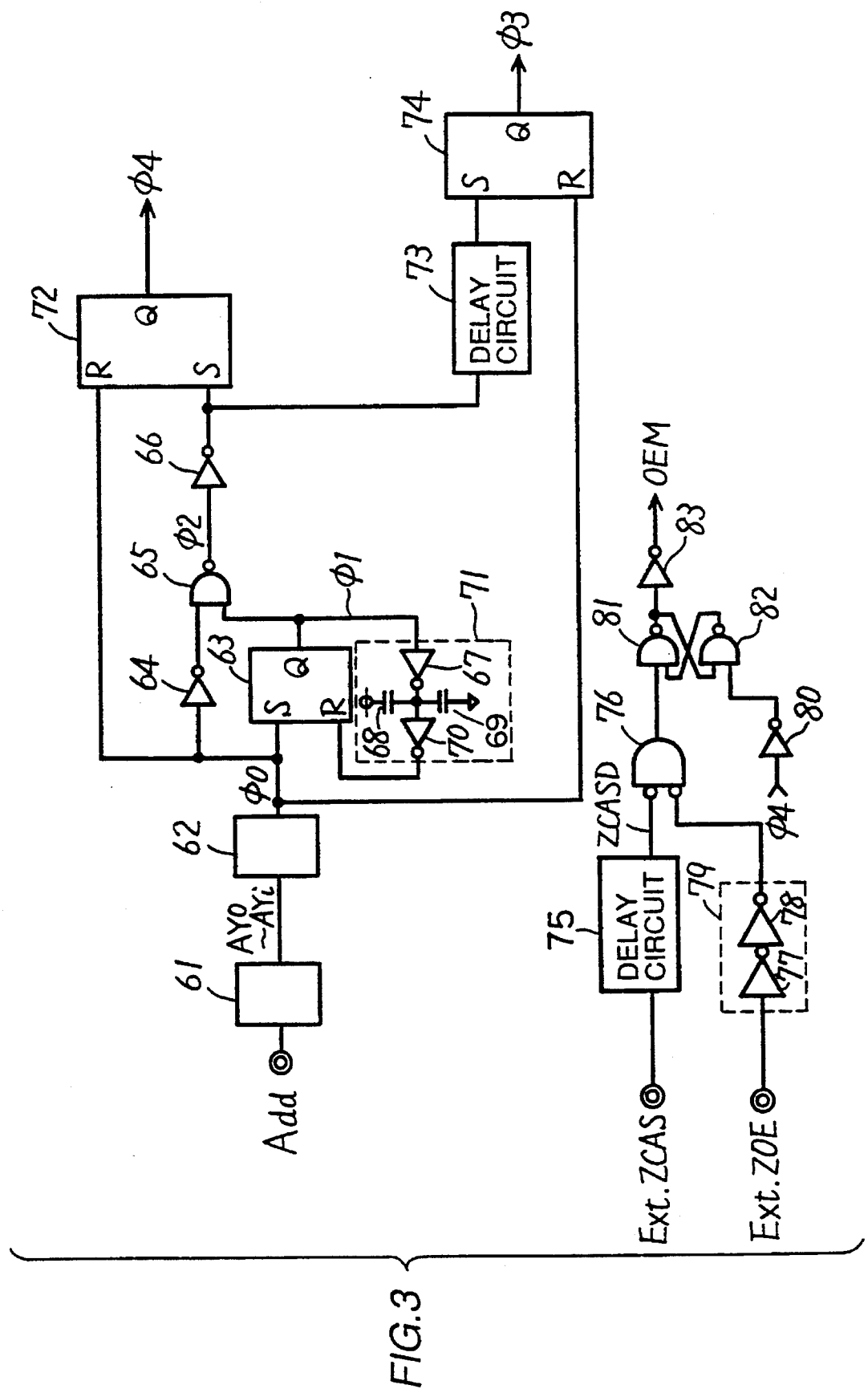
FIG. 3 is a circuit diagram of a control signal generating circuit shown in FIG. 2.

Control signal generating circuit 48 will now be described below in detail. FIG. 3 is a circuit diagram of control signal generating circuit 48.

Control signal generating circuit 48 includes a column address buffer 61, an address change detecting circuit 62, R-S flip-flops 63, 72 and 74, delay circuit 71, 73 and 75, inverters 64, 66, 77, 78, 80 and 83, NAND gates 65, 81, 82, and an NAND gate 76.

Delay circuit 71 includes inverters 67 and 70, a PMOS capacitor 68 and an NMOS capacitor 69. Other delay circuits 73 and 75 have the same structures as delay circuit 71.

Column address buffer 61 receives external address signal Add, and generates internal Y-addresses AY0–AYi. Address change detecting circuit 62 receives internal Y-address signals AY0–AYi, and generates a signal $\phi0$ indicative of the change of internal Y-address signals. Delay circuit 71 is connected between an output terminal Q and an input terminal R of R-S flip-flop 63. R-S flip-flop 63 receives signal 40 on its input terminal S, and generates signal $\phi1$ from its output terminal Q.

NAND gate 65 receives on its input terminals signal $\phi1$ and a signal formed by inverting signal $\phi0$ with inverter 64. NAND gate 65 generates signal $\phi2$ from its output terminal. R-S flip-flop 72 receives on its input terminal R signal $\phi0$, and also receives on its input terminal S a signal formed by inverting signal $\phi2$ with inverter 66. R-S flip-flop 72 generates signal $\phi4$ from its output terminal Q.

R-S flip-flop 74 receives on its input terminal R signal $\phi0$, and also receives on its input terminal S a signal formed by inverting signal $\phi2$ with inverter 66 via delay circuit 73. R-S flip-flop 74 generates signal $\phi3$ from its output terminal Q.

Delay circuit 75 receives and delays external column address strobe signal Ext.ZCAS to output a signal ZCASD. NOR gate 76 receives signal ZCASD as well as external output enable signal Ext.ZOE via inverters 77 and 78, and outputs a signal corresponding to the received signals.

NAND gate 82 receives on its input terminals signal $\phi4$ inverted by inverter 80 and an output signal of NAND gate 81, and outputs a signal corresponding to the received signals. NAND gate 81 receives on its input terminals output signal of NAND gate 76 and the output signal of NAND gate 82, and outputs a signal corresponding to the received signals. The signal sent from NAND gate 81 is inverted by inverter 83 to form signal OEM.

Figure 4:
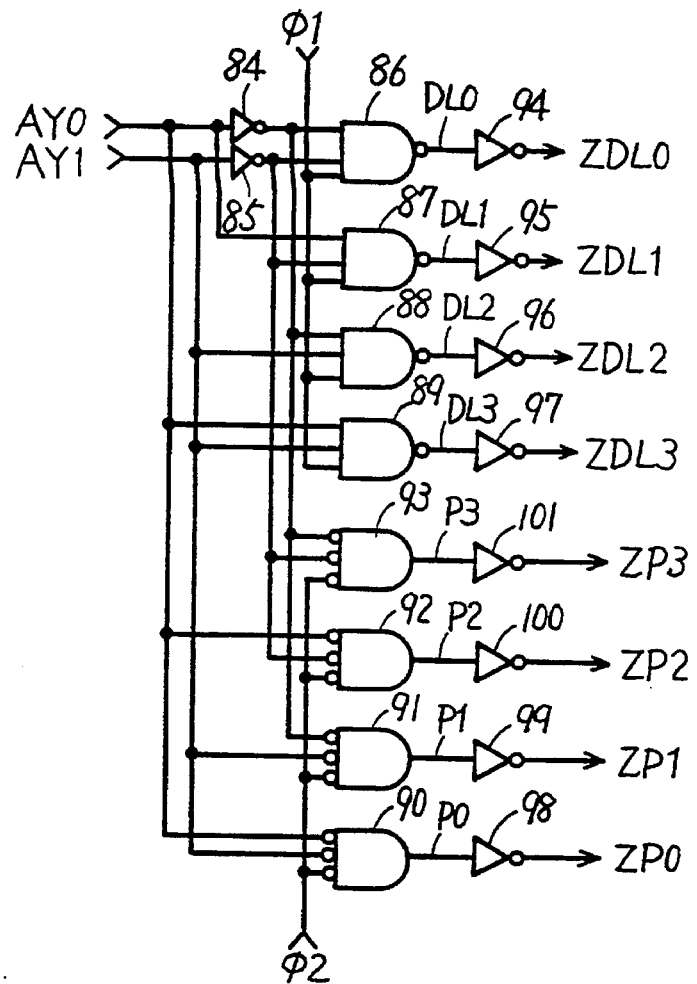
FIG. 4 is a circuit diagram of the control signal generating circuit shown in FIG. 2.

Control signal generating circuit 49 will now be described below in detail. FIG. 4 is a schematic circuit diagram of column signal generating circuit 49.

Referring to FIG. 4, column signal generating circuit 49 includes inverters 84, 85, 94, 95, 96, 97, 98, 99, 100 and 101, 3-input NAND gates 86, 87, 88 and 89, and 3-input NOR gate 90, 91, 92 and 93. Inverter 84 inverts internal Y-address signal AY0, and inverter 85 inverts internal Y-address signal AY1.

NAND gate 86 receives an inverted signal of internal Y-address signal AY0, an inverted signal of internal Y-address signal AY1 and signal $\phi1$, and outputs signal DL0. NAND gate 87 receives internal Y-address signal AY0, the inverted signal of internal Y-address signal AY1 and signal $\phi1$, and outputs signal DL1. NAND gate 88 receives the inverted signal of internal Y-address signal AY0, internal Y-address signal AY1 and signal $\phi1$, and outputs signal DL2. NAND gate 89 receives internal Y-address signals AY0 and AY1 as well as signal $\phi1$, and outputs signal DL3.

Inverter 94 receives signal DL0 and produces an inverted signal ZDL0 thereof. Inverter 95 receives signal DL1 and produces an inverted signal ZDL1 thereof. Inverter 96 receives signal DL2 and produces an inverted signal ZDL2 thereof. Inverter 97 receives signal DL3 and produces an inverted signal ZDL3 thereof.

NOR gate 90 receives internal Y-address signals AY0 and AY1 as well as signal $\phi2$, and generates signal P0. NOR gate 91 receives an inverted signal of internal Y-address signal AY0 as well as internal Y-address signal AY1 and signal $\phi2$, and generates signal P1. NOR gate 92 receives internal Y-address signal AY0, an inverted signal of internal Y-address signal AY1 and signal $\phi2$, and generates signal P2. NOR gate 93 receives the inverted signal of internal Y-address signal AY0, the inverted signal of internal Y-address signal AY1 and signal $\phi2$, and outputs signal P3.

Inverter 98 receives signal P0 and produces inverted signal ZP0 thereof. Inverter 99 receives signal P1 and produces inverted signal ZP1 thereof. Inverter 100 receives signal P2 and produces inverted signal ZP2 thereof. Inverter 101 receives signal P3 and produces inverted signal ZP3 thereof.

Figure 5:
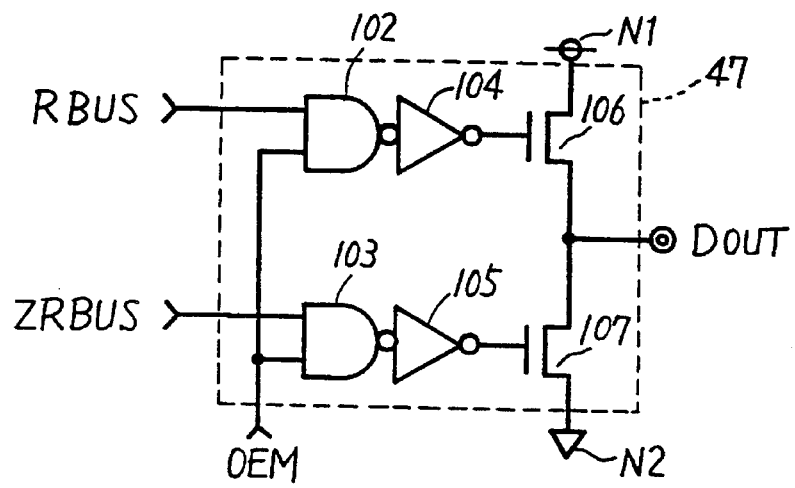
FIG. 5 is a circuit diagram of an output buffer shown in FIG. 2.

Then, output buffer 47 will be described below in detail. FIG. 5 is a circuit diagram of output buffer 47.

Output buffer 47 includes NAND gates 102 and 103, inverters 104 and 105, and NMOS transistors 106 and 107. Transistors 106 and 107 are connected in serial between a first power supply node N1, which receives a first potential, and a second power supply node N2, which receives a second potential lower than the first potential.

A node between transistors 106 and 107 is connected to external output terminal DOUT. NAND gate 102 receives, on its input terminal, signal OEM as well as signal RBUS sent from read data bus RBUS. Inverter 104 is connected between an output terminal of NAND gate 102 and transistor 106.

NAND gate 103 receives signal OEM as well as signal ZRBUS sent from read data bus ZRBUS. Inverter 105 is connected between an output terminal of NAND gate 103 and a gate of transistor 107.

Then, description will be given on the operation of the read circuit shown in FIG. 2 in which data read from the memory cell is output from output terminal DOUT.

Referring to FIG. 2, one of differential amplifier circuits 27a–27d differentially amplifies the potential difference of the corresponding I/O line pair. One of CMOS transfer gates 31–34, which corresponds to the differential amplifier circuit actually performing the differential amplification, becomes conductive.

Thereby, the output signal of the differential amplifier circuit is supplied to data latch circuit 28. Thus, CMOS transfer gates 31–34 operate as a selector for selectively supplying one of output signals RD0–RD3 of differential amplifier circuits 27a–27d to data latch circuit 28.

Data latch circuit 28 outputs signal RDA as well as the inverted signal ZRDA of the same. Read data bus driver circuit 42 transmits signals RDA and ZRDA to read data buses RBUS and ZRBUS, respectively. Output buffer 47 supplies external output data signal DOUT to external output terminal DOUT in response to signals RBUS and ZRBUS sent from read data buses RBUS and ZRBUS, respectively.

Each of the data buses, which extend between differential amplifier circuits 27a–27d and CMOS transfer gates 31–34, respectively, is formed of a single line, but the data bus between read data bus driver circuit 42 and output buffer 47 has a complementary structure.

External output data signal DOUT supplied from output buffer 47 attains a high impedance when both signals RBUS and ZRBUS are low. Also, external output data signal DOUT becomes high when signal RBUS is high and ZRBUS is low, and becomes low when signal RBUS is low and signal ZRBUS is high.

Therefore, during a period for which signal $\phi3$ for activating read data bus driver circuit 42 is low, external output data signal DOUT maintains a high impedance state regardless of values of signals RDA and ZRDA. Accordingly, activation signal $\phi3$ may be set to high at the time when the output signal of any one of differential amplifier circuits 27a–27d reaches read data bus driver circuit 42, whereby a transitional state of differential amplifier circuits 27a–27d does not appear in external output data signal DOUT, and only the correct data appears in the external output data signal DOUT.

As described above, circuits between differential amplifier circuits 27a–27d and read data bus driver circuit 42 are disposed near memory cell array 100. Therefore, read data buses RBUS and ZRBUS extend in semiconductor chip CH from the vicinity of memory cell array 100 to output buffer 47 located near an output pad. Read data bus driver circuit 42 is disposed closely to memory cell array 100 as compared with output buffer 47.

Therefore, a delay time of signals RDA–ZRDA with respect to output signals RD0–RD3 of differential amplifier circuits 27a–27d is short. Thus, only a short time is required until signal $\phi 3$ is set to high after activation of any one of differential amplifier circuits 27a–27d. Accordingly, it is possible to reduce a time margin for the timing of setting signal $\phi 3$ to high, which is required taking variation of the operations of differential amplifier circuits 27a–27d into consideration.

Figure 6:
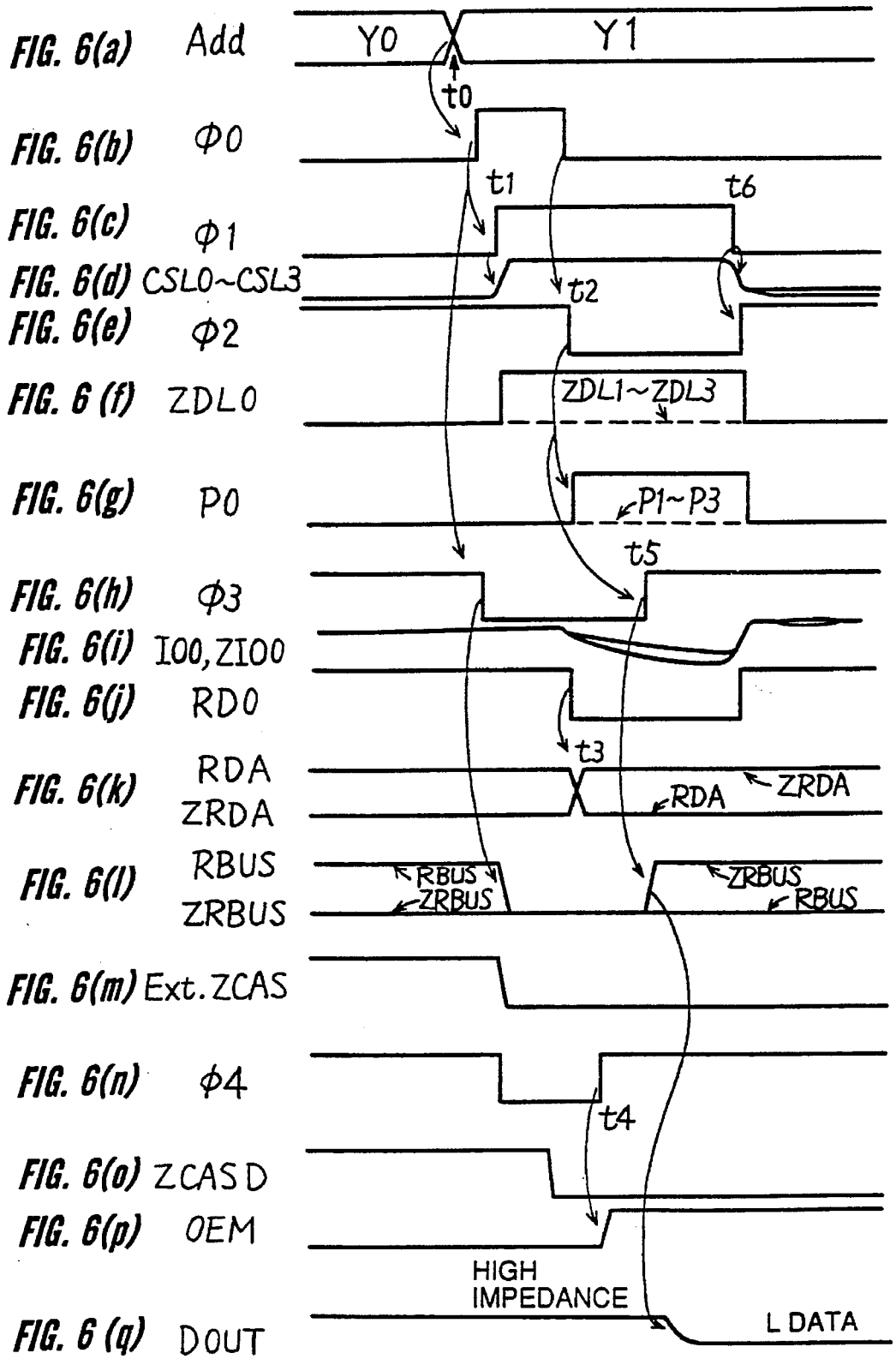
FIG. 6 is a timing chart showing the operation of the data read circuit shown in FIG. 2.

The data read operation of the read circuit shown in FIG. 2 will be described below in greater detail with reference to a timing chart. FIG. 6 is a timing chart showing the operation of the data read circuit in FIG. 2. The following description will be given in connection with the case where the address of external address signal Add changes from address Y0 to Y1, and the address Y1 is accessed.

Referring to FIG. 6, the address of external address signal Add changes from Y0 to Y1 at time t0 in order to access address Y1. Thereby, signal $\phi 0$ supplied from address change detection circuit 62 becomes high. Thereby, S-R flip-flop 63 is set, and signal $\phi 1$ becomes high at time t1.

S-R flip-flop 63 is reset upon elapsing of a delay time of delay circuit 71, and signal $\phi 1$ becomes low at time t6. In accordance with this, signal $\phi 2$ becomes high, signals ZDL0 and P0 become low, and signal DL0 becomes high. As a result, read data read from the memory cell is stored in data latch circuit 28.

It is assumed that, in the case where external address signal Add is Y1, both of signals AY0 and AY1 of two bits among internal Y-address signals AY0–AYi are low, and read data transmitted onto one I/O line pair IO0 and ZIO0 among four I/O line pairs is amplified and externally output.

When row decoder 1 selects word line WL, and signal $\phi 1$ becomes high at time t1, column decoders 2, 8, 14 and 20 select column select lines CSL0, CSL1, CSL2 and CSL3, respectively, so that potential difference is caused on each of four I/O line pairs IO0, ZIO0–IO3, ZIO3 by the read data.

In response to the change of signal $\phi 0$ to high, S-R flip-flop 74 is reset, and signal $\phi 3$ becomes low. As a result, read data bus driver circuit 42 sets both signals RBUS and ZRBUS on read data buses RBUS and ZRBUS to low. When signal $\phi 0$ changes from high to low, signal $\phi 2$ becomes low at time t2.

Referring to FIG. 4, control signal generating circuit 49 operates as follows. As a result of decoding of internal Y-address signals AY0 and AY1, only signal DL0 among signals DL0–DL3 becomes high, and only signal ZDL0 among signals ZDL0–ZDL3 becomes low. At time t2, only signal P0 among signals P0–P3 becomes high, and signal ZP0 among signals ZP0–ZP3 becomes low.

Thereby, differential amplifier circuit 27a amplifies the potential difference of one I/O line pair IO0 and ZIO0 among the four I/O line pairs. One CMOS transfer gate 31 among the four CMOS transfer gates becomes conductive owing to signals DL0 and ZDL0, so that signal RD0 supplied from differential amplifier circuit 27a is sent through CMOS transfer gate 31 to data latch circuit 28.

Thereby, data latch circuit 28 applies signals RDA and ZRDA to read data bus driver circuit 42 at time t3. FIG. 6 shows the case where the read data is low, and thus signal RD0 is low.

After the read data is transmitted to read data bus driver circuit 42, signal $\phi 3$ becomes high at time t5. Thereby, read data bus RBUS becomes low and read data bus ZRBUS becomes high, so that the read data is driven. The signal OEM for operating output buffer 47 maintains the high level until read data bus driver circuit 42 starts its operation.

Output buffer 47 is supplied with signals RBUS and ZRBUS corresponding to the read data, so that the external output data signal at the low level is sent to external output terminal DOUT.

In the above operation, both signals RBUS and ZRBUS are low until the read data is transmitted to output buffer 47, so that output buffer 47 attains the following state when it receives the read data. Before the read data is transmitted to output buffer 47, both transistors 106 and 107 are off, and external output terminal DOUT maintains the high impedance state. Meanwhile, when it receives the read data, only one of transistors 106 and 107 becomes conductive, so that the data signal is sent to external output terminal DOUT.

As described above, signal $\phi 3$ activating read data bus driver circuit 42 is set to high at the time when the read data which was correctly amplified by one of differential amplifier circuits 27a–27d is transmitted as signals RDA and ZRDA which are supplied to read data bus driver circuit 42. Thereby, only the correct read data can be sent to external output terminal DOUT without sending thereto the transitional state of differential amplifier circuits 27a–27d.

The above operation will be described below in greater detail. Signal $\phi 4$ becomes high at time t4 after it temporarily became low in response to signal $\phi 0$. At the time when signal $\phi 4$ becomes high, if signal ZCASD is low, signal OEM becomes high.

At this time, however, signal $\phi 3$ activating read data bus driver circuit 42 is low, so that both read data buses RBUS and ZRBUS are low. Therefore, external output terminal DOUT maintains the high impedance state.

When signal $\phi 3$ becomes high at time t5, the output signal of one of differential amplifier circuits 27a–27d is transmitted to read data buses RBUS and ZRBUS via data latch circuit 28 and read data bus driver circuit 42. Thereby, the correct external output data signal is sent to external output terminal DOUT in accordance with the states of read data buses RBUS and ZRBUS.

Second Embodiment

Figure 7:
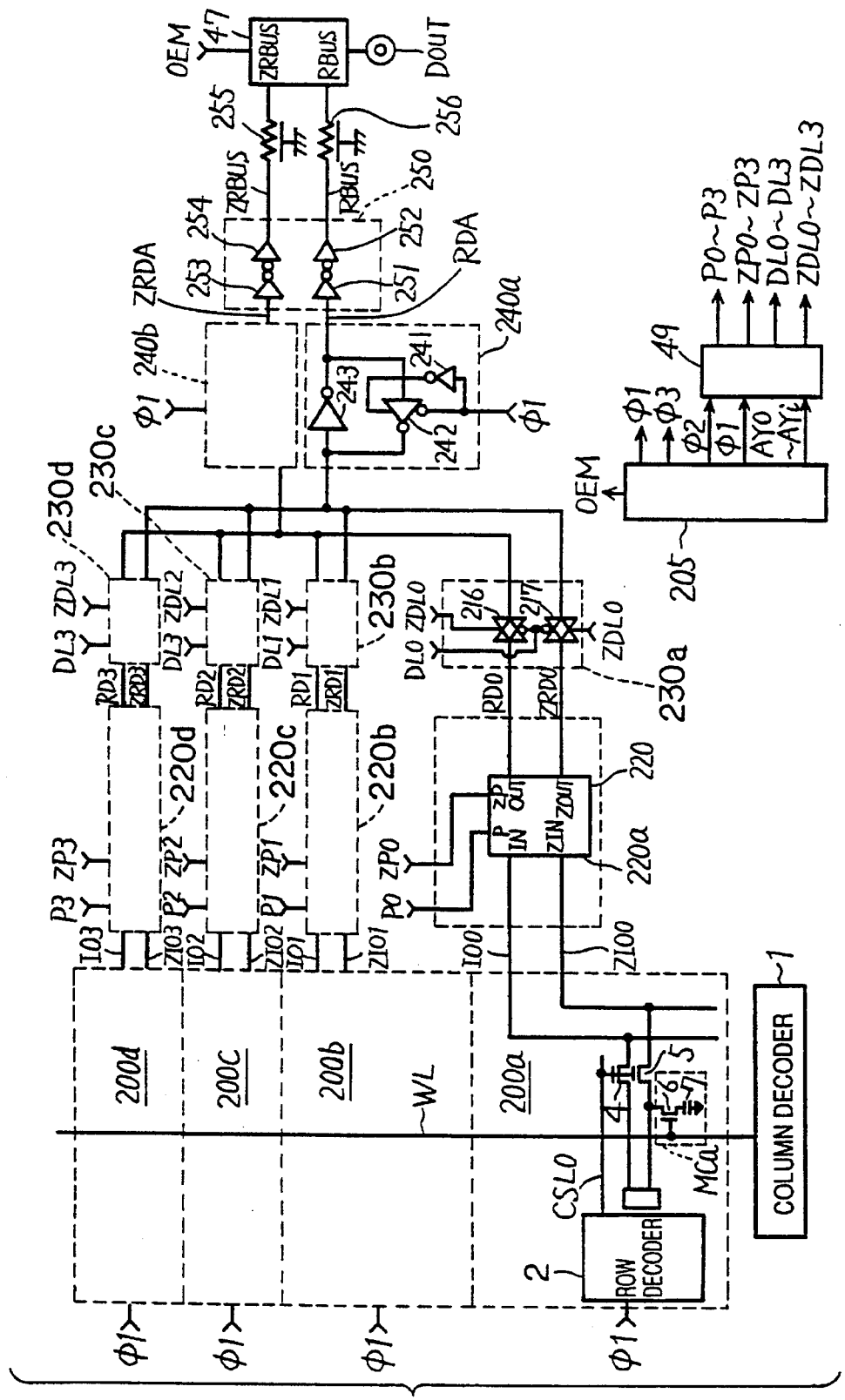
FIG. 7 is a circuit diagram of a data read circuit in a semiconductor memory device of a second embodiment.

A second embodiment will now be described below. In the following description, the second embodiment relates to a case where it is not necessary to delay the operation of read data bus driver circuit. FIG. 7 is a circuit diagram of the data read circuit between the memory cell array and the output buffer in the semiconductor memory device of the second embodiment.

Referring to FIG. 7, the data read circuit in FIG. 7 differs from the data read circuit in FIG. 2 in the structures of a control signal generating circuit 205, differential amplifier circuits 220a–220d, selector circuits 230a–230d and a read data bus driver circuit 250 as well as the number of data latch circuits 240a and 240b, and interconnection paths from differential amplifier circuits 220a–220d to data latch circuits 240a and 240b.

Each of differential amplifier circuits 220a–220d includes a differential amplifier 220 which differentially amplifies potentials on I/O line pair to output complementary signals. Each of selector circuits 230a–230d includes two CMOS transfer gates. For example, selector circuit 230a includes CMOS transfer gates 216 and 217.

CMOS transfer gates 216 and 217 receive signals DL0 and ZDL0, respectively. CMOS transfer gate 216 transfers one of signals RD0 sent from differential amplifier circuit 220a to data latch circuit 240b. CMOS transfer gate 217 transfers the other signal ZRD0 sent from differential amplifier circuit 220a to data latch circuit 240a.

The relationship between each of differential amplifier circuit 220b, 220c and 220d and corresponding one of selector circuits 230b, 230 and 230d is the same as that between the differential amplifier circuit 220a and selector circuit 230a.

Data latch circuit 240a includes inverters 241 and 243 as well as clocked inverter 242. This structure of data latch circuit 240a is the same as that of data latch circuit 28 in FIG. 2. Data latch circuit 240b has the same structure as data latch circuit 240a.

Data latch circuit 240a receives one of signals ZRD0–ZRD3 sent from selector circuit 230a–230d. Data latch circuit 240a applies a signal RDA formed by inversion of the received signal to read data bus driver 250. Data latch circuit 240b receives one of signals RD0–RD3 sent from selector circuits 230a–230d. Data latch circuit 240b supplies a signal ZRDA formed by inversion of the received signal to read data bus driver circuit 250.

Read data bus driver circuit 250 includes a set of inverters 253 and 254 connected together in serial, and also includes another set of inverters 251 and 252 connected together in serial. In read data bus driver circuit 250, incoming signal RDA is transmitted to read data bus RBUS via inverters 251 and 252. Also in read data bus driver circuit 250, incoming signal ZRDA is transmitted to read data bus ZRBUS via inverters 253 and 254.

Figure 8:
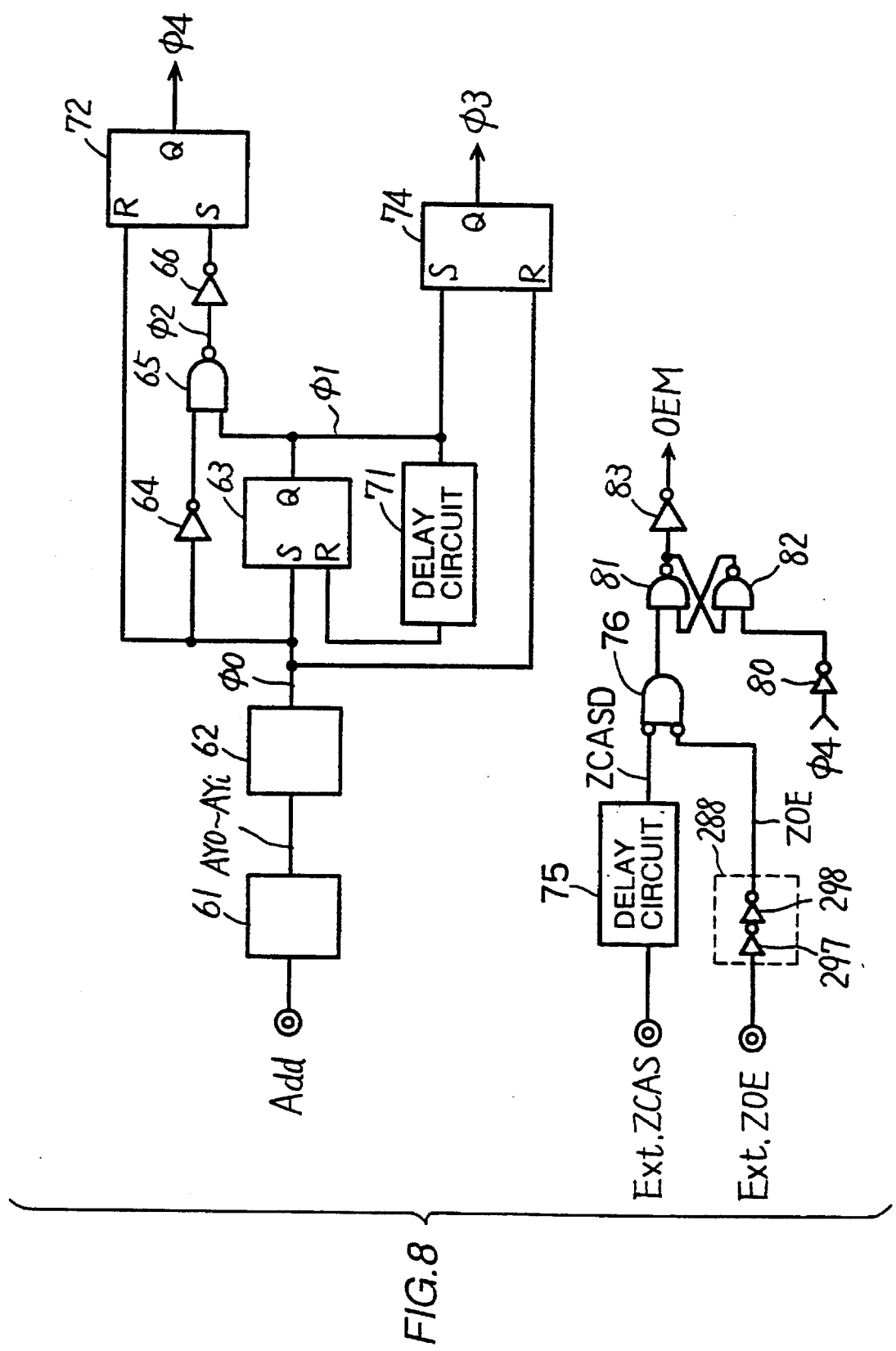
FIG. 8 is a circuit diagram of a control signal generating circuit shown in FIG. 7.

Control signal generating circuit 205 will now be described below in greater detail. FIG. 8 is a circuit diagram of control signal generating circuit 205.

Referring to FIG. 8, the control signal generating circuit 205 shown in FIG. 8 differs from control signal generating circuit 48 shown in FIG. 3 in that a signal supplied to input terminal S of S-R flip-flop 74 is not a signal supplied from inverter 66 via delay circuit 73, but is signal $\phi 1$ supplied from S-R flip-flop 63. The other structures of control signal generating circuit 205 are the same as those of control signal generating circuit 48.

Figure 9:
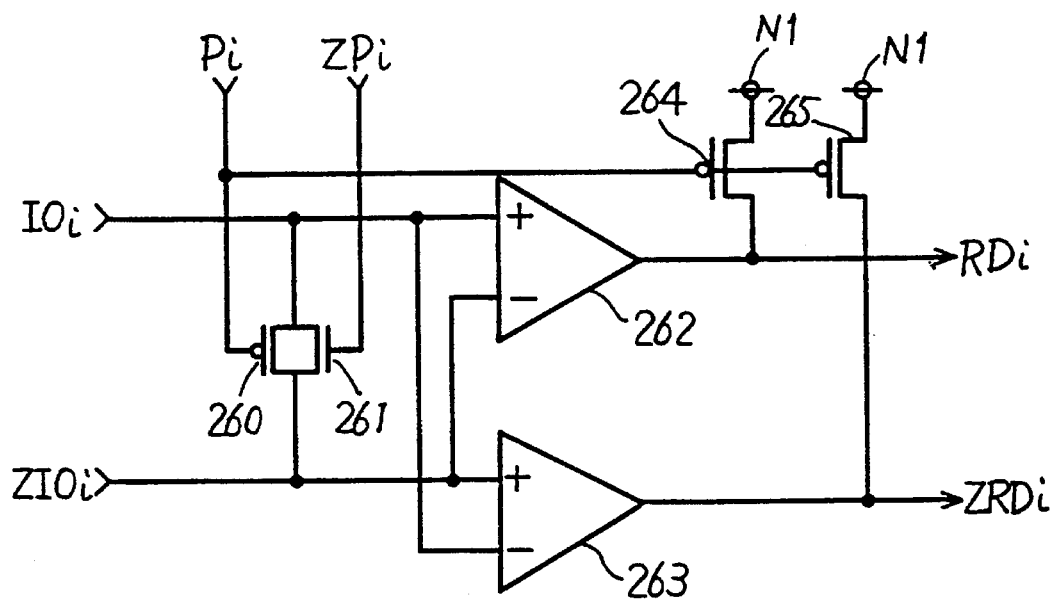
FIG. 9 is a circuit diagram of a differential amplifier shown in FIG. 7.

Then, differential amplifier 220 included in each of differential amplifier circuits 220a–220d will be described below in detail. FIG. 9 is a circuit diagram of differential amplifier 220. Differential amplifier 220 includes PMOS transistors 260, 264 and 265, an NMOS transistor 261 and differential amplifiers 262 and 263.

Transistors 260 and 261 have commonly connected sources and commonly connected drains, and are connected between paired I/O lines IOi and ZIOi. Transistor 260 receives signal Pi on its gate. Transistor 261 receives signal ZPi on its gate. These transistors 260 and 261 are provided for equalizing I/O line pair IOi and ZIOi.

I/O line IOi is connected to a positive input terminal of differential amplifier 262 and a negative input terminal of differential amplifier 263. I/O line ZIOi is connected to a negative input terminal of differential amplifier 262 and a positive input terminal of differential amplifier 263.

A transistor 264 is connected between power supply node N1 receiving the power supply potential and an output terminal of differential amplifier 262. A transistor 265 is connected between power supply node N1 and differential amplifier 263. Transistor 264 and 265 each receive signal Pi on their gates. These transistors 264 and 265 are provided for setting signals RDi and ZRDi, which are sent from differential amplifiers 262 and 263, to the same level as the power supply potential when differential amplifiers are in the standby state.

Figure 10:
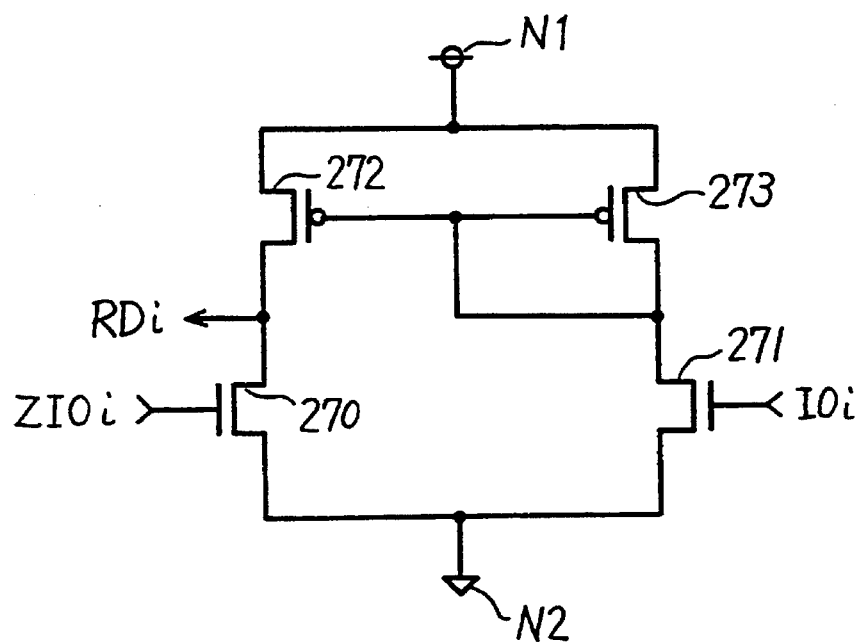
FIG. 10 is a circuit diagram of the differential amplifier shown in FIG. 7.

Differential amplifiers 262 and 263 will be described below in greater detail. Differential amplifiers 262 and 263 have the same structure. FIG. 10 is a circuit diagram showing the structure of differential amplifiers 262 or 263.

Referring to FIG. 10, the differential amplifier includes NMOS transistors 270 and 271 as well as PMOS transistors 272 and 273. Transistors 272 and 270 are connected in serial between first power supply node N1 and second power supply node N2. Transistors 273 and 271 are also connected in serial between first power supply node N1 and second power supply node N2. Transistors 272 and 273 have gates, each of which is connected to a node between transistors 273 and 271.

Transistor 270 has a gate connected to I/O line ZIOi. Transistor 271 has a gate connected to I/O line IOi. Signal RDi resulting from differential amplification is sent from a node between transistors 272 and 270. The differential amplifier shown in FIG. 10 is of a current mirror type, and differential amplifier 263 is of the same type, i.e., current mirror type.

The read circuit described above employs the completely complementary structures in the paths for read data from respective I/O line pairs IO0, ZIO0–IO3, ZIO3 to output buffer 47. In the data read circuit in FIG. 7, data read from memory cells MCa–MCd are transmitted from memory cell array portions 200a–200d to I/O line pairs IO0, ZIO0–IO3, ZIO3.

One of differential amplifier circuits 220a–220d is operated, and complementary signals supplied therefrom are transmitted to data latch circuits 240a and 240b via the selector circuit corresponding to the operated differential amplifier circuit.

Signals RDA and ZRDA supplied from data latch circuits 240a and 240b are transmitted to read data buses RBUS and ZRBUS via read data bus driver circuit 250, respectively. These signals are then applied to output buffer 47.

The operation of read circuit shown in FIG. 7 will now be described below. FIG. 11 is a timing chart showing the operation of the read circuit in FIG. 7. The following description will be given on the case where the Y-address of external address signal Add changes from Y0 to Y1.

Referring to FIG. 11, when the Y-address of external address signal changes from Y0 to Y1 at time t0, both internal Y-address signals AY0 and AY1 change from high to low. At this time, a pulse signal generates in signal $\phi 0$ supplied from address change detection circuit 62 in FIG. 8.

When signal $\phi 0$ becomes high, S-R flip-flop 63 is set, so that signal $\phi 1$ becomes high at time t1. In response to this, column decoders 2, 8, 14 and 20 and thus column select lines CSL0–CSL3 become high.

Since both internal Y-address signals AY0 and AY1 become low, only signal DL0 among signals DL0–DL3, which were high, becomes low. Thereby, only signal ZDL0 among signals ZDL0–ZDL3 becomes high. As a result, only selector circuit 230a among four selector circuits 230a–230d becomes conductive, and thus only signals RD0 and ZRD0 among four sets of signals RD0, ZRD0–RD3, ZRD3 are supplied to data latch circuits 240a and 240b, respectively.

At time t1, each of signals P0–P3 for activating the differential amplifier circuits is low, and each of signals ZP0–ZP3 is high. At this time, therefore, differential amplifier circuits 220a–220d output signals RD0, ZRD0–RD3, ZRD3 at the high level.

Therefore, signals RDA and ZRDA supplied from data latch circuits 240a and 240b are low, and thus read data bus driver circuit 250 outputs signals RBUS and ZRBUS at the low level. This state where signals RDA and ZRDA are low or signals RBUS and ZRBUS are low will be referred to as a reset state hereafter.

In the reset state, external output terminal DOUT maintains the high impedance state, even if external column address strobe signal Ext.ZCAS becomes low and signal OEM becomes high.

When signal $\phi2$ becomes low at time t2 in response to the fact that both signals $\phi0$ and $\phi1$ become high, signals AY0 and AY1 of two bits in the internal Y-address signal are decoded. Thereby, only signal P0 among signals P0–P3 becomes high, and similarly, only signal ZP0 among signals ZP0–ZP3 becomes low.

Thereby, only differential amplifier circuit 220a among four differential amplifier circuits 220a–220d operates. Thus, the potential difference of I/O line pair IO0 and ZIO0 is amplified. As a result, the state where both signals RD0 and ZRD0 are high changes at time t3 to the state where signal RD0 is high and signal ZRD0 is low. It should be noted that the above operation is performed when data to be read is high.

When signal RD0 becomes high and signal ZRD0 becomes low at time t3, the reset state where both signals RDA and ZRDA are low changes to the state where signal RDA is high and signal ZRDA is low. Thereby, the reset state where both signals RBUS and ZRBUS are low changes to the new state where signal RBUS is high and signal ZRBUS is low.

In the new state, transistor 106 in output buffer 47 becomes conductive, so that external output data signal DOUT applied to external output terminal DOUT becomes high.

When signal $\phi1$, which became high at time t1, becomes low at time t6 determined by delay circuit 71, signals RD0 and ZRD0 are stored in data latch circuits 240a and 240b, respectively.

The operation of output buffer 47 and a circuitry for generating signal OEM activating output buffer 47 will be described below with reference to a timing chart of FIG. 12.

Referring to FIG. 12, when the Y-address of external address signal Add changes from Y0 to Y1 at time t0, signal $\phi0$ becomes high, so that R-S flip-flop 72 is reset. Thereby, signal $\phi4$ becomes low at time t5. While signal $\phi4$ is low, signal OEM maintains the low level until data at Y-address Y1 is reset, even if signal ZCASD, which is the delayed signal of external column address strobe signal Ext.ZCAS, becomes low.

At time t6, signal $\phi2$ becomes low, and differential amplifier circuit 220a starts the operation. Simultaneously with this, signal $\phi4$ becomes high, so that signal OEM becomes high.

At this time, the read data is not yet transmitted to output buffer 47, and signals RBUS and ZRBUS are in the reset state of low. Therefore, both transistors 106 and 107 of output buffer 47 are nonconductive, and the external output terminal DOUT is in the high impedance state.

Before time t7, signal OEM is high and both signals RBUS and ZRBUS are low and thus in the reset state. At time t7, signal RBUS becomes high and thus the read data at the high level is read. In response to this, external output data signal DOUT applied to external output terminal DOUT becomes high.

In the read circuit shown in FIG. 7, the complementary structures are employed in the signal paths from I/O line pairs IO0, ZIO0–IO3, ZIO3 to output buffer 47, so that the following effect can be obtained. It is not necessary to delay the timing of the operation of output buffer 47 and read data bus driver circuit 250 until the correct data read from differential amplifier circuits 220a–220d reaches read data bus driver circuit 250 or output buffer 47. Therefore, the access time for reading data from memory cells MCa–MCd can be reduced.

In addition to the advantages of the data read circuit shown in FIG. 2, the data read circuit shown in FIG. 7 has such an advantage that it is not necessary to dispose read data bus driver circuit 250 near I/O line pairs IO0, ZIO0–IO3, ZIO3.

Figure 13:
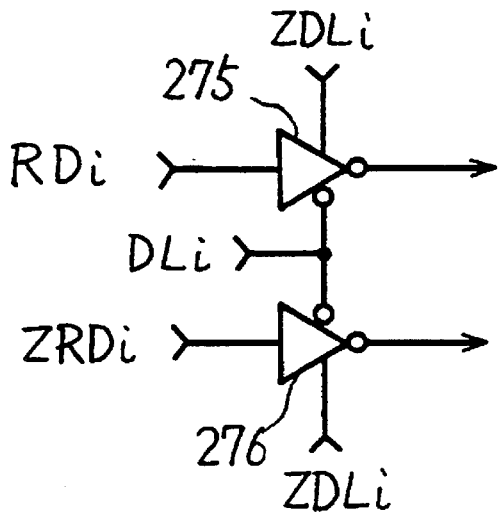
FIG. 13 is a circuit diagram showing another embodiment of a selector circuit shown in FIG. 7.

Each of selector circuits 230a–230d shown in FIG. 7 may be formed of CMOS clocked inverters which will be described below. FIG. 13 is a circuit diagram showing another embodiment of selector circuits 230a–230d.

Referring to FIG. 13, the selector circuit includes clocked inverters 275 and 276. Clocked inverters 275 and 276 receive signals DLi and ZDLi for receiving the same, respectively. In response to the received signal, clocked inverter 275 inverts signal RDi for outputting the same, and clocked inverter 276 inverts signal ZRDi for outputting the same.

Figure 14:
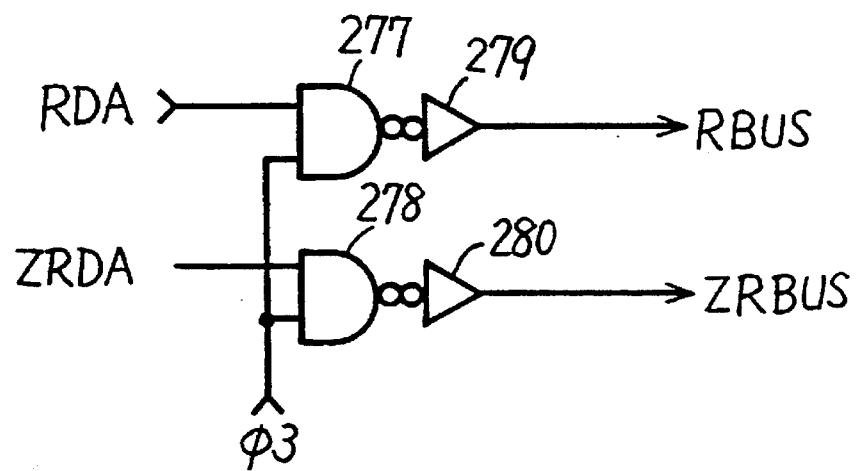
FIG. 14 is a circuit diagram of another embodiment of a read data bus driver circuit shown in FIG. 7.

Read data bus driver circuit 250 shown in FIG. 7 may have the following circuit structure. FIG. 14 is a circuit diagram showing another specific embodiment of read data bus driver circuit shown in FIG. 7.

Read data bus driver circuit in FIG. 14 includes NAND gates 277 and 278 as well as inverters 279 and 280. This circuit has the same structure as read data bus driver circuit 42 shown in FIG. 2.

Then, description will be given on the operation of the data read circuity in FIG. 7 to which the read data bus driver circuit in FIG. 14 is applied. FIG. 15 is a timing chart showing the operation of data read circuit to which the read data bus driver circuit in FIG. 14 is applied.

Times t1–t4 in FIG. 15 are the same as the times t1–t4 shown in the timing chart of FIG. 11.

Referring to FIG. 15, when signal $\phi0$ becomes high, S-R flip-flop 74 shown in FIG. 8 is reset. Thereby, signal $\phi3$ becomes low at time t10. At this time, signals RDA and ZRDA output from data latch circuits 240a and 240b still maintains the last data.

In this case, however, both signals RBUS and ZRBUS output from the read data bus driver circuit in FIG. 14 are low. Therefore, read data buses RBUS and ZRBUS are reset before the above last data disappears.

In the read data bus driver circuit in FIG. 14, read data buses RBUS and ZRBUS can be reset at the timing preceding the timing for read data bus driver circuit 250 shown in FIG. 7 as described above.

When signal ZDL0 becomes high, both signals RDA and ZRDA become low in response to the high level of signals RD0 and ZRD0, so that data latch circuits 240a and 240b are reset.

Meanwhile, if signal $\phi1$ becomes high at time t1, S-R flip-flop 74 is set. Thereby, signal $\phi3$ becomes high at time t20. Differential amplifier 220a operates at time t3 to transmit its output signals to read data buses RBUS and ZRBUS via selector circuit 230a, data latch circuits 240a and 240b, and the read data bus driver circuit. Thereby, output buffer 47 outputs external output data signal DOUT.

Also in this case, signal φ3 becomes high before the read data reaches the read data bus driver circuit in FIG. 14. Therefore, after differential amplifier circuit 220a supplies signals RD0 and ZRD0, each circuit in the path of the signals RD0 and ZRD0 supplies the read data at the timing determined in accordance of the timing of the read data itself, until signals RD0 and ZRD0 arrive at output buffer 47. Therefore, signals applied to the respective circuits for controlling the same do not cause any delay in the access time.

Figure 16:
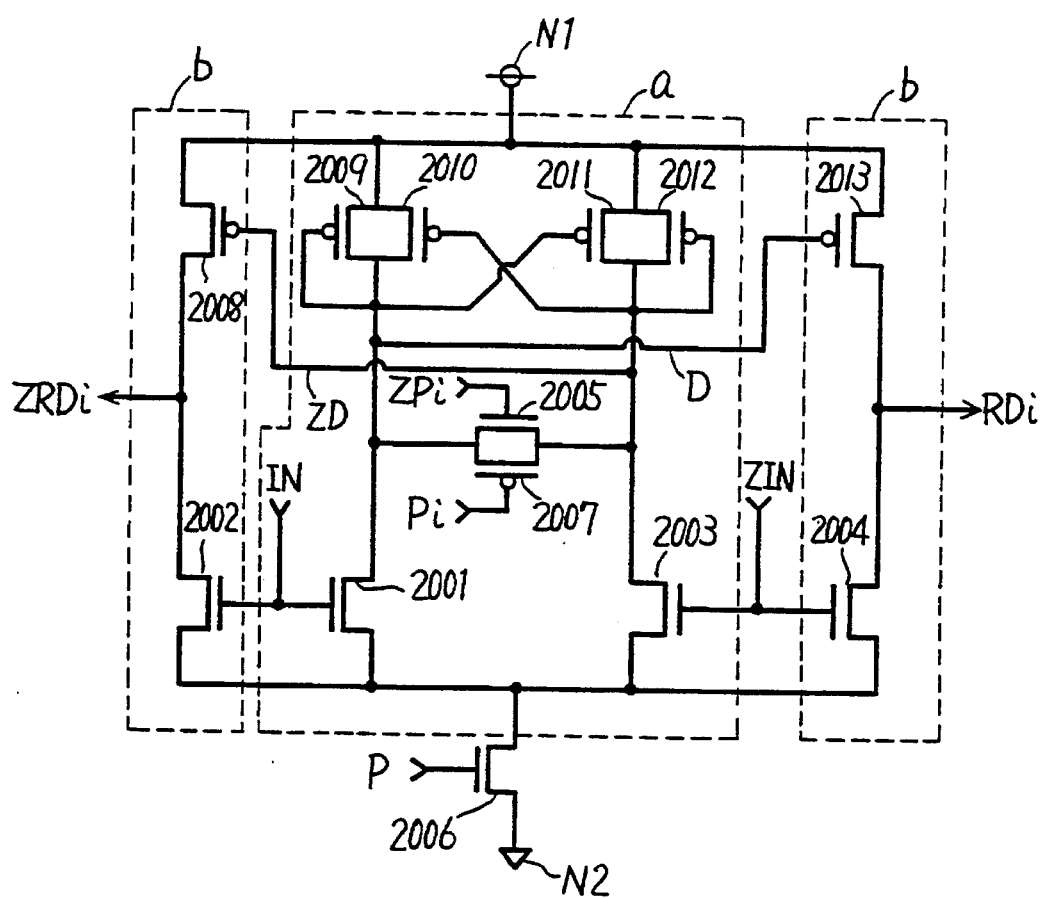
FIG. 16 is a circuit diagram showing another embodiment of the differential amplifier circuit shown in FIG. 7.

Another embodiment of differential amplifier circuits 220a–220d in the data read circuit in FIG. 7 will now be described below. FIG. 16 is a circuit diagram showing another embodiment of differential amplifier circuits 220a–220d shown in FIG. 7.

Referring to FIG. 16, a differential amplifier circuit includes a differential amplifier a, an inverter b and an NMOS transistor 2006. Differential amplifier a includes PMOS transistors 2007, 2009, 2010, 2011 and 2012 as well as NMOS transistors 2001, 2003 and 2005. Inverter b includes PMOS transistors 2008 and 2013 as well as NMOS transistors 2002 and 2004.

Transistor 2006 is connected between second power supply node N2 and each of differential amplifier a and inverter b. Transistors 2009 and 2010 have commonly connected sources and commonly connected drains. Transistor 2001 is connected in serial to transistors 2009 and 2010 which are commonly connected between first power supply node N1 and transistor 2006. Transistors 2009 and 2010 have drains connected to a drain of transistor 2001.

Transistors 2011 and 2012 have commonly connected sources and commonly connected drains. Transistor 2003 is connected in serial to transistors 2001 and 2012 which are commonly connected between first power supply node N1 and transistor 2006. Transistors 2011 and 2012 have drains connected to a drain of transistor 2003.

Transistors 2009 and 2011 have gates connected to the common drain of transistors 2009 and 2010. Transistors 2010 and 2012 have gates connected to the common drain of transistors 2011 and 2012. Transistor 2001 receives on its gate a signal IN from one of the I/O lines. Transistor 2003 receives on its gate a signal ZIN from the other of I/O lines.

Transistors 2005 and 2007 are connected in parallel between the node, which is formed between transistor 2001 and transistors 2009 and 2010, and the node, which is formed between transistor 2003 and transistors 2011 and 2012. Transistor 2005 receives signal ZPi on its gate. Transistor 2007 receives signal Pi on its gate.

Transistors 2008 and 2002 are connected in serial between first power supply node N1 and transistor 2006. Transistor 2008 has a gate connected to the node between transistor 2003 and transistors 2001 and 2012. Transistor 2002 receives signal IN on its gate. Signal ZRDi resulting from differential amplification is supplied from the node between transistors 2008 and 2002.

Transistors 2013 and 2004 are connected in serial between first power supply node N1 and transistor 2006. Transistor 2013 has a gate connected to the node between transistor 2001 and transistors 2009 and 2010. Transistor 2004 receives signal ZIN on its gate. Signal RDi resulting from differential amplification is supplied from the node between transistors 2013 and 2004.

The above differential amplifier circuit has such a function that it does not change the levels of signals RDi and ZRDi supplied therefrom even if the levels of incoming signals IN and ZIN change with respect to a reference level. Thus, the differential amplifier has a function of compensating variation of voltage.

Then, the function of compensating the voltage variation will be described below. Transistors 2001 and 2002 are turned on and off in a similar manner. Transistors 2003 and 2004 are turned on and off in a similar manner.

Transistors 2011 and 2013 are responsive to the potential of drain of transistor 2001 to be turned on and off in a similar manner. Transistors 2010 and 2008 are responsive to the potential of drain of transistor 2003 to be turned on and off in a similar manner.

Transistors 2010 and 2011 are cross-coupled. Therefore, when transistor 2001 or 2002 is turned on, one of transistors 2010 and 2011 is turned on and the other is turned off in response to the potential of drain of the turned-on transistor.

Therefore, if transistor 2002 is turned on in response to incoming signal IN, transistor 2013 is turned on. If transistor 2004 is turned on in response to incoming signal ZIN, transistor 2008 is turned on. Thereby, output signals RDi and ZRDi becomes complementary to each other.

When the levels of respective signals IN and ZIN change, the following operation is performed. If both transistors 2001 and 2002 are strongly turned on in accordance with the level change of signal IN, the potentials of drains of these transistors change with respect to the normal operation level.

Thereby, the level of output signals ZRDi may change. Meanwhile, if the potential of drain of transistor 2001 changes, the potential of common drain of transistors 2011 and 2012 changes oppositely, because transistors 2010 and 2011 are cross-coupled. Thereby, transistor 2008 is weakly turned off.

As described above, even if the transistor 2002 is strongly turned on, transistor 2008 is weakly turned off. Therefore, the change of signal ZRDi caused by the change of the on state of transistor 2002 is canceled with the change of the off state of transistor 2008.

Therefore, even if the level of signal IN changes, the change of signal ZRDi is suppressed. This function is performed likewise with respect to signal RDi. Further, this function is performed likewise in the case where signal ZIN changes.

Therefore, the differential amplifier circuit can compensate the level change of each of input signals IN and ZIN. Accordingly, a high voltage gain can be maintained even if respective incoming signals IN and ZIN change.

In the differential amplifier circuit thus constructed, the differential amplifier a amplifies the incoming signals IN and ZIN to generate the complementary outputs, i.e., signals D and ZD. Inverter b receives signals D, ZD, IN and ZIN, and generates signals RDi and ZRDi. Inverter b has a large voltage gain with respect to the level change of signals IN and ZIN, because signals IN and ZIN are supplied directly to the gates of transistors 2002 and 2004.

Therefore, the differential amplifier circuit in FIG. 16 has a larger voltage gain than the differential amplifier circuit in FIG. 9. Since the larger voltage gain enables amplification of the input voltage at a higher speed, the differential amplifier circuit in FIG. 16 can reduce the through current during the operation and thus can reduce the current consumption as compared with the differential amplifier circuit in FIG. 9.

Third Embodiment

Figure 17:
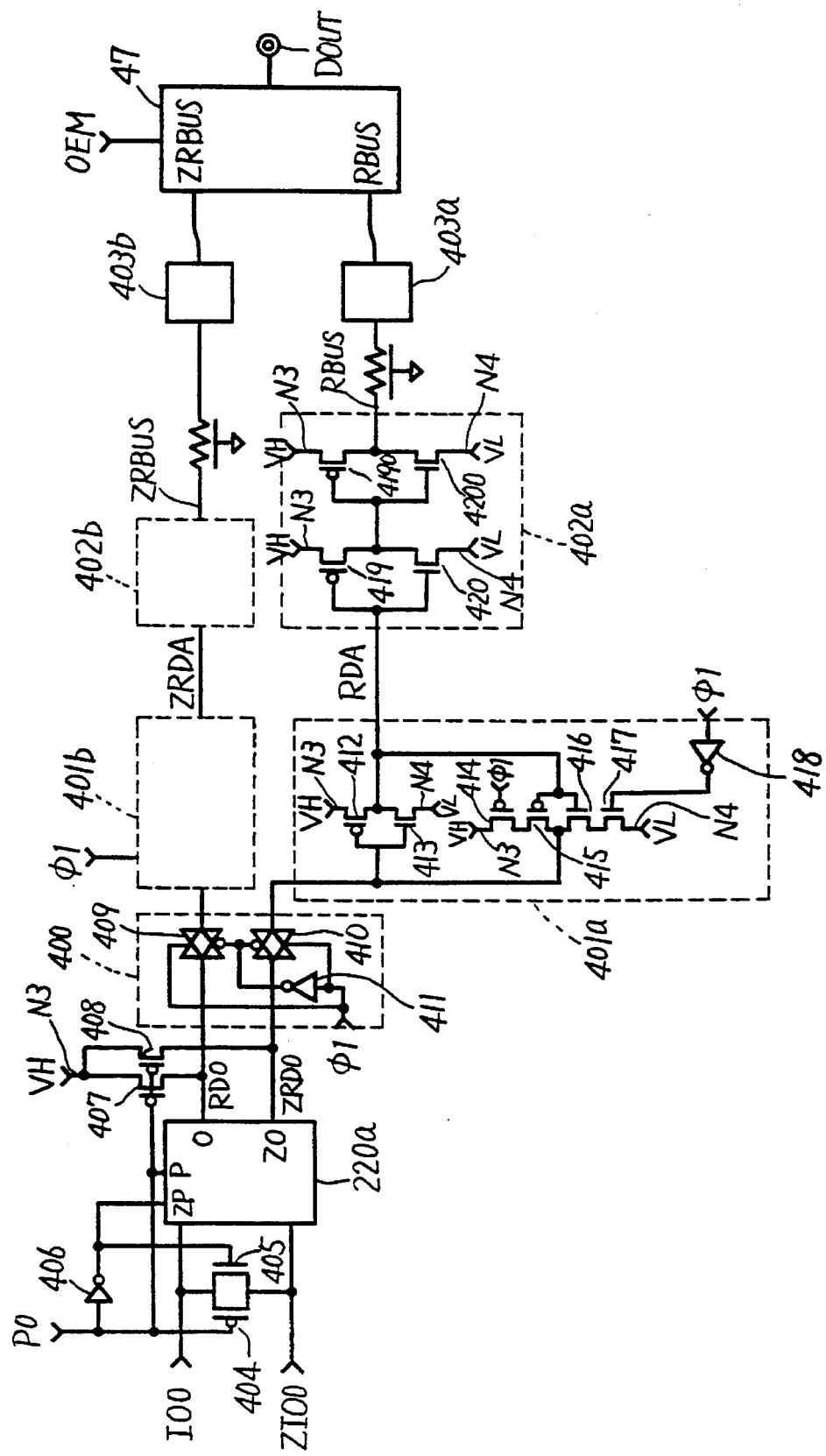
FIG. 17 is a circuit diagram of a data read circuit in a semiconductor memory device of a third embodiment.

A third embodiment will be described below. FIG. 17 is a circuit diagram of a data read circuit in a semiconductor memory device of the third embodiment. FIG. 17 shows only one of paths from the I/O line pairs to the selector circuits, and does not show the other paths. The data read circuit shown in FIG. 17 employs a complementary structure in the signal line for transmitting signals between the I/O line pairs and the output buffer similarly to the data read circuit shown in FIG. 7.

The data read circuit in FIG. 17 has such a distinctive feature that the amplitude of voltage of signal transferred from the differential amplifier circuit to the read data bus is smaller than that in the data read circuit shown in FIG. 7, and level shifting of the signal having such a small amplitude is performed before applying the same to the output buffer.

The data read circuit in FIG. 17 includes PMOS transistors 404, 407 and 408, an NMOS transistor 405, an inverter 406, differential amplifier circuit 220a, a selector circuit 400, data latch circuits 401a and 401b, read data bus driver circuits 402a and 402b, read data buses RBUS and ZRBUS, level shifting circuits 403a and 403b, and output buffer 47.

Differential amplifier circuit 220 is similar to differential amplifier circuit 220a shown in FIG. 7. Transistors 404 and 405 are connected in parallel between I/O lines IO0 and ZIO0. Transistor 404 receives signal P0 on its gate. Transistor 405 receives signal ZP0, which is formed by inverting signal P0 with inverter 406, on its gate.

Transistor 407 is connected between one of complementary signal lines, which are arranged between differential amplifier circuit 220a and selector circuit 400, and a power supply node N3 receiving a potential VH lower than the power supply potential. Transistor 408 is connected between the other of the complementary signal lines and power supply node N3. Transistors 407 and 408 receive signal P0 on their gates.

Selector circuit 400 includes CMOS transfer gates 409 and 410 as well as an inverter 411. Each of CMOS transfer gates 409 and 410 receives signal φ1 and the inverted signal of signal φ1 supplied from inverter 411. In response to these signals, CMOS transfer gate 409 transmits signal RD0 supplied from differential amplifier circuit 220 to data latch circuit 401b. CMOS transfer gate 410 transfers signal ZRD0 supplied from differential amplifier circuit 220a to data latch circuit 401a.

Data latch circuit 401a has the same structure as data latch circuit 401b. Data latch circuit 401a includes PMOS transistors 412, 414 and 415, NMOS transistors 413, 416 and 417, and an inverter 418. A power supply node N4 receives a potential VL higher than the ground potential. Potential VL is lower than potential VH.

Transistors 412 and 413 are connected in serial between power supply nodes N3 and N4. Transistors 412 and 413 receive on their gates a signal sent from CMOS transfer gate 410. A signal RDA is supplied from a node between transistors 412 and 413. These transistors 412 and 413 form an inverter.

Transistors 414, 415, 416 and 417 are connected in serial between power supply nodes N3 and N4. Transistor 414 receives signal φ1 on its gate. Transistor 417 receives an inverted signal of signal φ1 on its gate. This inverted signal is supplied from inverter 418.

Respective gates of transistors 415 and 416 are connected to a node between transistors 412 and 413. A node between transistors 415 and 416 is connected to respective gates of transistors 412 and 413. These transistors 414, 415, 416 and 417 form a clocked inverter. Data latch circuit 401b outputs signal ZRDA.

Read data bus driver circuit 402a includes PMOS transistors 419 and 4190 as well as NMOS transistors 420 and 4200. Transistors 419 and 420 are connected in serial between power supply nodes N3 and N4. Likewise, transistors 4190 and 4200 are connected in serial between power supply nodes N3 and N4.

A node between transistors 419 and 420 is connected to respective gates of transistors 4190 and 4200. Transistors 419 and 420 receive signal RDA on their gates. In this read data bus driver circuit 402a, a set of transistors 419 and 420 form an inverter, and a set of transistors 4190 and 4200 also form an inverter. A node between transistors 4190 and 4200 is connected to read data bus RBUS.

Read data bus driver circuit 402b has the same structure as read data bus driver circuit 402a. Read data bus driver circuit 402b is connected to read data bus ZRBUS.

Level shifting circuit 403a is arranged at the end of read data bus RBUS near output buffer 47, and transmits a signal on read data bus RBUS to output buffer 47. Level shifting circuit 403b is arranged at the end of read data bus ZRBUS near output buffer 47, and transmits a signal on read data bus ZRBUS to output buffer 47.

Figure 18:
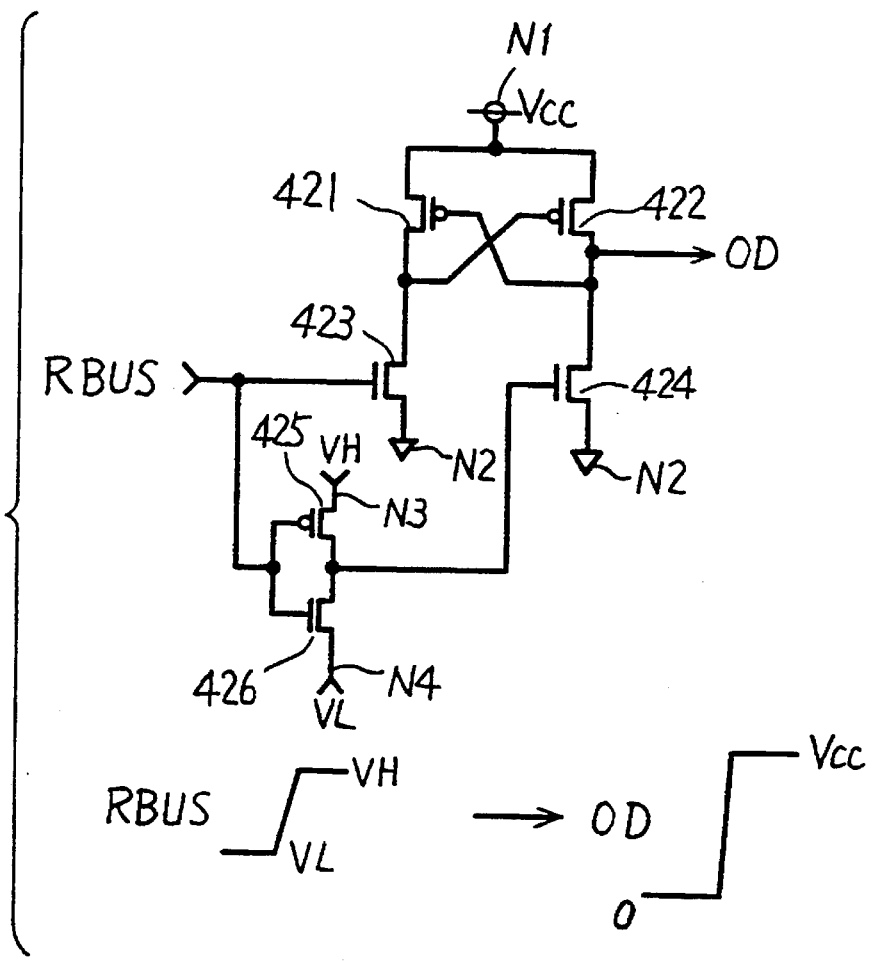
FIG. 18 is a circuit diagram of a level shifting circuit shown in FIG. 17.

Then, level shifting circuits 403a and 403b shown in FIG. 17 will be described below in detail. Since these level shifting circuits 403a and 403b have the same structure, only level shifting circuit 403a will be described below. FIG. 18 is a circuit diagram of level shifting circuit 403a shown in FIG. 17.

Referring to FIG. 18, level shifting circuit 403a includes PMOS transistors 421, 422 and 425 as well as NMOS transistors 423, 424 and 426. Transistors 425 and 426 are connected in serial between power supply nodes N3 and N4. Transistors 424 and 426 receive, on their respective gates, signal RBUS from read data bus RBUS.

Transistors 421 and 423 are connected in serial between power supply nodes N1 and N2. Transistors 422 and 424 are also connected in serial between power supply nodes N1 and N2.

A gate of transistor 421 is connected to a node between transistors 422 and 424. A gate of transistor 422 is connected to a node between transistors 421 and 423. A gate of transistor 423 receives signal RBUS. A gate of transistor 424 is connected to a node between transistors 425 and 426.

In this level shifting circuit 403a, a low potential of incoming signal RBUS is equal to potential VL and a high potential thereof is equal to potential VH. When the potential of signal RBUS changes from low to high, transistor 423 is turned on, and transistor 424 is turned off. The gate of transistor 422 becomes low, so that transistor 422 is turned on and transistor 421 is turned off, whereby the potential of signal OD changes from 0V to VCC.

In the data read circuit shown in FIG. 17, the high level of signals RD0 and ZRD0 supplied from differential amplifier circuit 220a is equal to potential VH which is lower than power supply potential VCC, and the low level thereof is equal to potential VL higher than the ground potential.

Therefore, each of signals RD0 and ZRD0 has the amplitude which is equal to VH when it is high, and is equal to VL when it is low. Thus, the amplitude of each signal is smaller than VCC. Signals RD0 and ZRD0 having such small amplitudes are transmitted to read data bus driver circuits 402a and 402b via selector circuits 401a and 401b.

Read data bus RBUS and ZRBUS are driven by the signals having such small amplitudes. The signals having the small amplitudes are supplied to output buffer 47 after the amplitudes are shifted by level shifting circuits 403a and 403 to the amplitudes of VCC.

The specific operation of the data read circuit in FIG. 17 will be described below. FIG. 19 is a timing chart showing the operation of the data read circuit in FIG. 17. Signals φ1 and P0 shown in FIG. 19 are the same as those shown in FIG. 7.

Referring to FIG. 19, signal φ1 becomes high at time t1, so that CMOS transfer gates 409 and 410 become conductive. Thereby, signals RD0 and ZRD0 supplied from differential amplifier circuit 220a are supplied to data latch circuits 401a and 401b. In this operation, signals RD0 and ZRD0 maintain the standby state, i.e., high level, because signal P0 is low at time t1.

Therefore, signals RDA and ZRDA supplied from data latch circuits 401a and 401b become low, and signals RBUS and ZRBUS supplied from read data bus driver circuits 402a and 402b become low. As a result, signals D0 and ZD0 supplied to the output buffer are reset to the low level.

Therefore, signals D0 and ZD0 become low if the read data is not yet transmitted to output buffer 47, in spite of the fact that external column address strobe signal Ext.ZCAS have become low and signal OEM becomes high at time t2. As a result, external output terminal DOUT is maintained at the high impedance state.

When signal P0 becomes high at time t3, differential amplifier circuit 220a amplifies the potential difference of read data transmitted onto I/0 line pair IO0 and ZIO0. The read data thus amplified is transmitted to output buffer 47, and is output from external output terminal DOUT. In the above operation, the amplitude of each of signals RD0 and ZRD0, signals RBUS and ZRBUS and other similar signals is equal to potential VH when it is high, and is equal to potential VL when it is low. Thus, the amplitude of voltage of these signals is smaller than that of the voltage in the conventional circuit.

Level shifting circuits 403a and 403b shift the high level of supplied signals from potential VH to potential VCC, and also shift the low level of supplied signals from potential VL to OV, so that signals D0 and ZD0 have the amplitude equal to VCC. When signals D0 and ZD0 of the amplitude equal to VCC are supplied to output buffer 47, the read data is supplied to external output terminal DOUT.

At time t4, signal P0 becomes low, and signal φ0 becomes low, so that the read data is stored in differential amplifier circuits 401a and 402b.

In the operation of transmitting the read data from I/O line pair IO0 and ZIO0 provided at the memory cell array to output buffer 47, signals having reduced amplitudes are transmitted as described above, so that it is possible to reduce the quantity of electric charges which are required for charging and discharging the data bus in the operation of transmitting the read data. As a result, the speed of transmission of read data increases, and current consumption at the data bus decreases.

Fourth Embodiment

Figure 20:
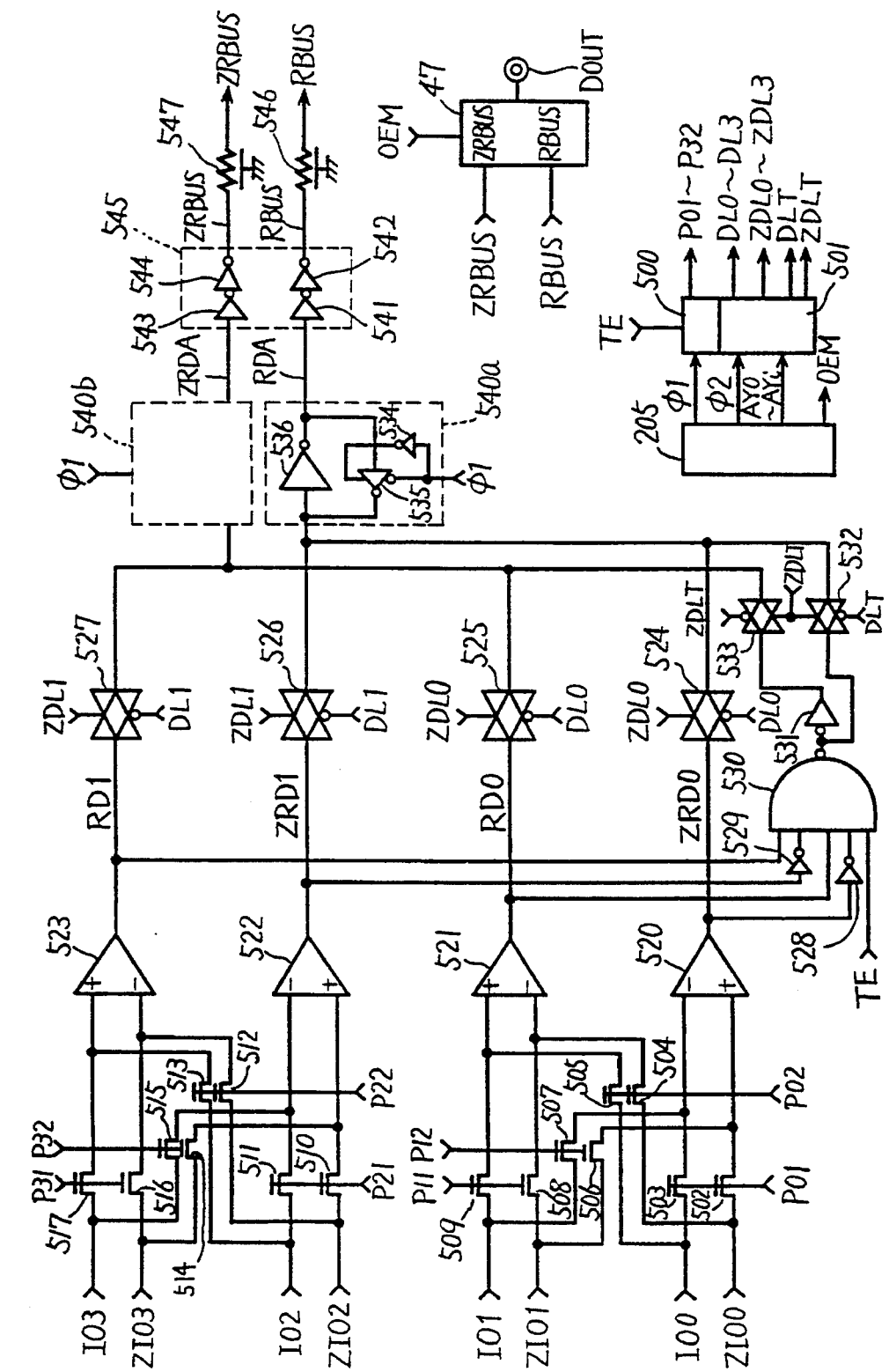
FIG. 20 is a circuit diagram of a data read circuit in a semiconductor memory device of a fourth embodiment.

A fourth embodiment will be described below. FIG. 20 is a circuit diagram of a data read circuit in a semiconductor memory device of the fourth embodiment.

The data read circuit in FIG. 20 differs from the data read circuit in FIG. 7 in a structure other the circuit provided between data latch circuits 540a and 540b and output buffer 47. In the data read circuit in FIG. 7, two differential amplifiers are provided for one I/O line pair, and these differential amplifier produce complementary signals as a result of differential amplification.

Meanwhile, in the data read circuit in FIG. 20, two differential amplifiers are provided for two I/O line pairs, and these two differential amplifiers produce complementary signals as a result of differential amplification. This amplification is selectively effected on one of the two I/O line pairs.

Referring to FIG. 20, the data read circuit includes NMOS transistors 502, 503, . . . 517, differential amplifier circuits 520, 521, 533 and 523, inverters 528, 529 and 531, an NAND gates 530, CMOS transfer gates 524, 525, 526, 527, 532 and 533, data latch circuits 540a and 540b, a read data bus driver circuit 545, read data buses RBUS and ZRBUS, output buffer 47, and control signal generating circuits 205 and 500.

Data latch circuits 540a and 540b have the same structures as data latch circuits 240a and 240b in FIG. 7. For example, differential amplifier circuit 540a includes inverters 534 and 536 as well as a clocked inverter 535. Read data bus driver circuit 545 has the same structure as read data bus driver circuit 250 in FIG. 7. Read data bus driver circuit 545 includes inverters 541, 542, 543 and 544.

I/O line IO0 is provided with transistor 503. I/O line ZIO0 is provided with transistor 502. Each of transistors 502 and 503 receives signal P01 on its gate. I/O line IO1 is provided with transistor 509. I/O line IO1 is provided with transistor 508. Each of transistor 508 and 509 receives signal P11 on its gate.

Transistor 504 is connected between a portion of I/O line ZIO0 extending to transistor 502 from the bit line side and a portion of I/O line ZIO1 extending from transistor 508 toward differential amplifier circuit 521. Transistor 505 is connected between a portion of I/O line IO0 extending to transistor 503 from the bit line side and a portion of I/O line IO1 extending from transistor 509 toward differential amplifier circuit 521. Transistor 506 is connected between a portion of I/O line ZIO0 extending from transistor 502 toward differential amplifier circuit 520 and a portion of I/O line ZIO1 extending to transistor 508 from the bit line side.

Transistor 507 is connected between a portion of I/O line IO0 extending from transistor 503 toward differential amplifier circuit 520 and a portion of I/O line IO1 extending to transistor 509 from the bit line side. Each of transistors 504 and 505 receives signal P02 on its gate. Each of transistors 506 and 507 receives signal P12 on its gate.

I/O line ZIO2 is provided with transistor 510. I/O line IO2 is provided with transistor 511. Each of transistors 510 and 511 receives signal P21 on its gate. I/O line ZIO3 is provided with transistor 516, and I/O line IO3 is provided with transistor 517. Each of transistors 516 and 517 receives signal P31 on its gate.

Transistor 512 is connected between a portion of I/O line ZIO2 extending to transistor 510 from the bit line side and a portion of I/O line ZIO3 extending from transistor 516 toward differential amplifier circuit 523. Transistor 513 is connected between a portion of I/O line IO2 extending to transistor 511 from the bit line side and a portion of I/O line IO3 extending from transistor 517 toward differential amplifier circuit 523.

Transistor 514 is connected between a portion of I/O line ZIO2 extending from transistor 510 toward differential amplifier circuit 522 and a portion of I/O line ZIO3 extending to transistor 516 from the bit line side. Transistor 515 is connected between a portion of I/O line IO2 extending from transistor 511 toward differential amplifier circuit 522 and a portion of I/O line IO3 extending to transistor 517 from the bit line side.

Differential amplifier circuit 520 has a positive input terminal connected to I/0 line ZIO0 and a negative input terminal connected to I/O line IO0. Differential amplifier circuit 521 has a positive input terminal connected to I/O line IO1 and a negative input terminal connected to I/O line ZIO1.

Differential amplifier circuit 522 has a positive input terminal connected to I/O line ZIO2 and a negative input terminal connected to I/O line IO2. Differential amplifier circuit 523 has a positive input terminal connected to I/O line IO3 and a negative input terminal connected to I/O line ZIO3.

Differential amplifier circuit 520 supplies signal ZRD0 via CMOS transfer gate 524 to data latch circuit 540a. Differential amplifier circuit 522 supplies signal ZRD1 via CMOS transfer gate 526 to data latch circuit 540a.

Differential amplifier circuit 521 supplies signal RD0 via CMOS transfer gate 525 to data latch circuit 540b. Differential amplifier circuit 523 supplies signal RD1 via CMOS transfer gate 527 to data latch circuit 540b.

Each of CMOS transfer gates 524 and 525 operates in response to signals DL0 and ZDL0. Each of CMOS transfer gates 526 and 527 operates in response to signals DL1 and ZDL1.

NAND gate 530 receives a test signal TE, an inverted signal of signal ZRD0 sent from inverter 528, signal RD0, an inverted signal of signal ZRD1 sent from inverter 529 and signal RD1. An output signal of NAND gate 530 is applied to CMOS transfer gate 532 and is also applied via inverter 531 to CMOS transfer gate 533.

CMOS transfer gate 532 operates in response to signals DL1 and ZDL1, and applies the signal, which is sent from the NAND gate 530, to data latch circuit 540a. CMOS transfer gate 533 operates in response to signals DLT and ZDLT, and applies the signal, which is sent from inverter 531, to data latch circuit 540b.

Control signal generating circuit 500 receives test signal TE, signal $\phi 2$, and internal Y-address signals AY0–AYi, and generates signals P01–P32. Control signal generating circuit 501 receives test signal TE, signal $\phi 1$, and internal Y-address signals AY0–AYi, and generates signals DL0–DL3, signals ZDL0–ZDL3, and signals DLT and ZDLT.

Figure 21:
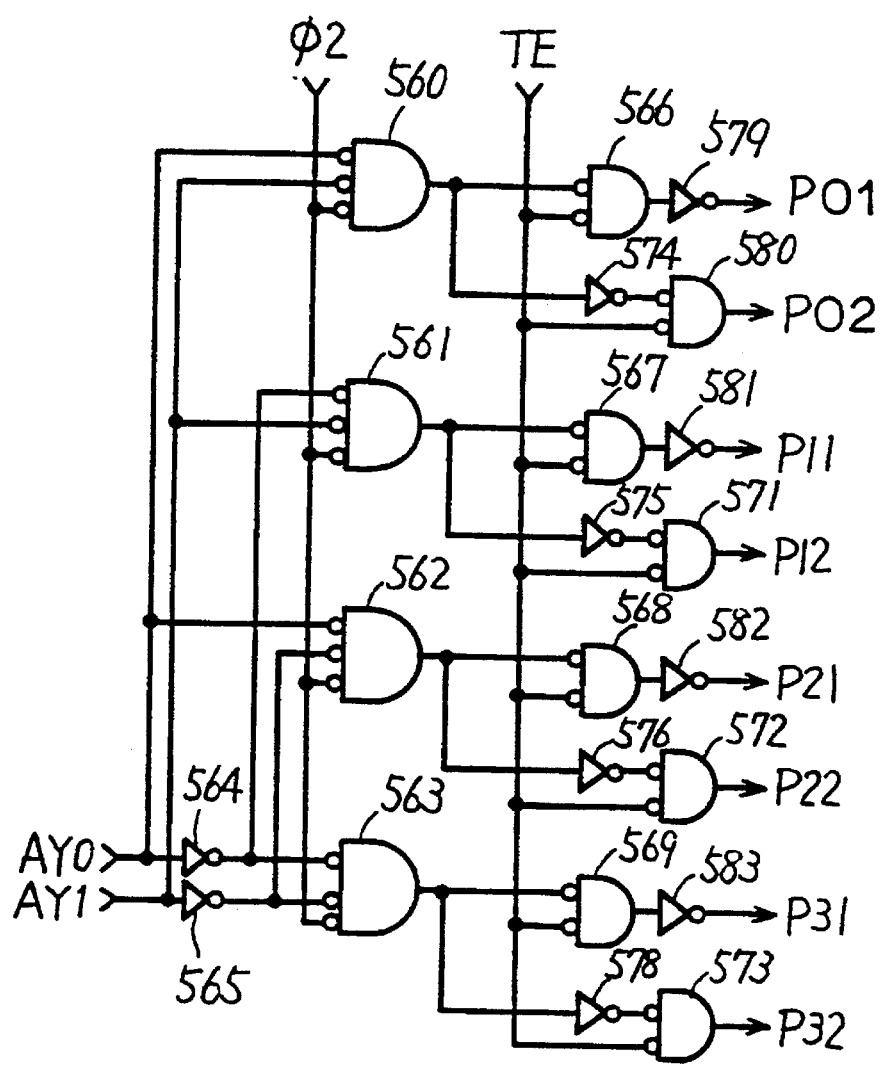
FIG. 21 is a circuit diagram of a control signal generating circuit shown in FIG. 20.

Control signal generating circuit 500 will be described below in greater detail. FIG. 21 is a circuit diagram of control signal generating circuit 500. Control signal generating circuit 500 includes 3-input NOR gates 560, 561, 562 and 563, 2-input NOR gates 566–569, 580, 571–573, and inverters 564, 565, 574, 575–579, 581, 582 and 583.

NOR gate 560 receives internal Y-address signals AY0 and AY1 as well as signal $\phi 2$. NOR gate 561 receives an inverted signal of internal Y-address signal AY0 sent from inverter 564 as well as internal Y-address signal AY1 and signal $\phi 2$. NOR gate 502 receives internal Y-address signal AY0, an inverted signal of internal Y-address signal AY1 sent from inverter 565, and signal $\phi 2$.

NOR gate 563 receives an inverted signal of internal Y-address signal AY0 sent from inverter 564, an inverted signal of internal Y-address signal AY1 sent from inverter 565, and signal $\phi 2$. NOR gate 566 receives an output signal of NOR gate 560 and test signal TE. NOR gate 566 outputs signal P01 via inverter 579.

NOR gate 580 receives an inverted signal of the output signal of NOR gate 560 sent from inverter 574 and test signal TE, and generates signal P02. NOR gate 576 receives the output signal of NOR gate 561 and test signal TE. NOR gate 567 generates signal P11 via inverter 581. NOR gate 571 receives an inverted signal of the output signal of NOR gate 561 sent from inverter 575 and test signal TE, and generates signal P12.

NOR gate 568 receives an output signal of NOR gate 562 and test signal TE. NOR gate 568 generates signal P21 via inverter 582. NOR gate 572 receives an inverted signal of an output signal of NOR gate 562 sent from inverter 576 and test signal TE, and generates signal P22.

NOR gate 569 receives an output signal of NOR gate 563 and test signal TE. NOR gate 569 generates signal P31 via inverter 583. NOR gate 573 receives an inverted signal of an output signal of NOR gate 563 sent from inverter 578 and test signal TE, and generates signal P32.

Figure 22:
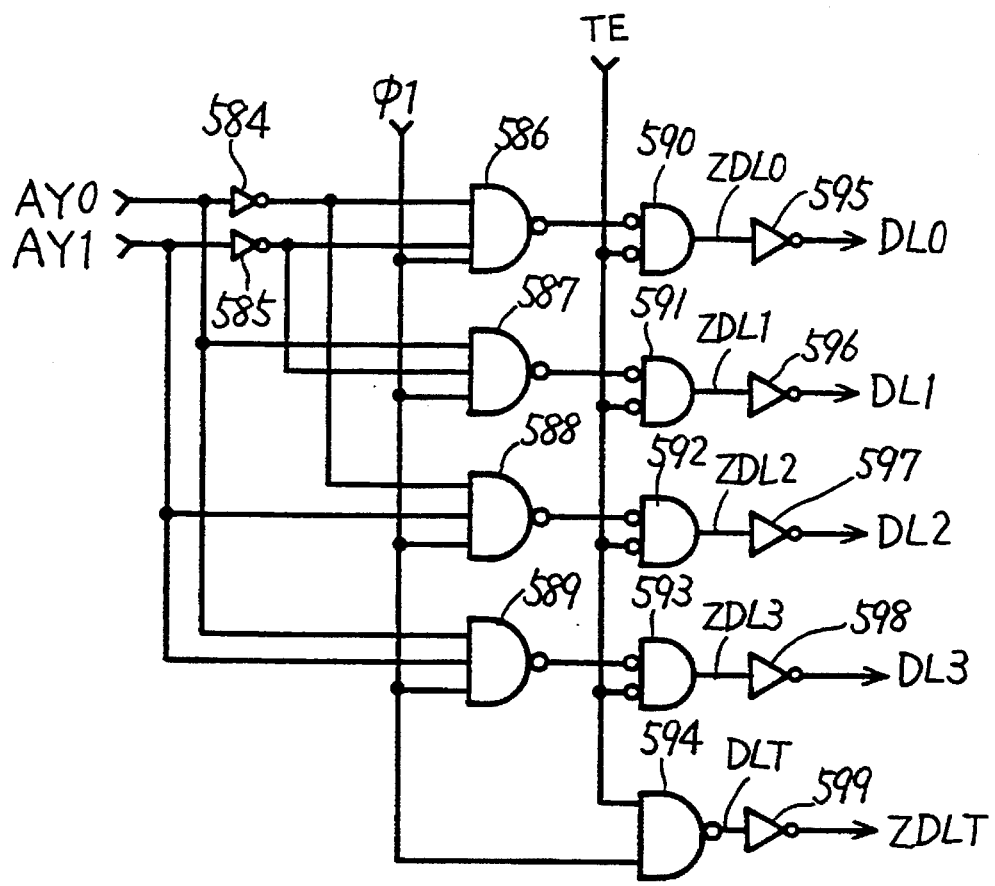
FIG. 22 is a circuit diagram of a control signal generating circuit shown in FIG. 20.

Control signal generating circuit 501 will be described below in greater detail. FIG. 22 is a circuit diagram of control signal generating circuit 501. Control signal generating circuit 501 includes 3-input NOR gates 586, 587, 588 and 589, 2-input NOR gates 590, 591, 592 and 593, a 2-input NAND gate 594, and inverters 584, 585, and 595–599.

NAND gate 586 receives an inverted signal of internal Y-address signal AY0 sent from inverter 584, an inverted signal of internal Y-address signal AY1 sent from inverter 585, and signal $\phi 1$. NAND gate 587 receives internal Y-address signal AY0, an inverted signal of internal Y-address signal AY1 sent from inverter 585, and signal $\phi 1$.

NAND gate 588 receives an inverted signal of internal Y-address signal AY0 sent from inverter 584, internal Y-address signal AY0 and signal $\phi 1$. NAND gate 589 receives internal Y-address signals AY0 and AY1, and signal $\phi 1$.

NOR gate 590 receives an output signal of NAND gate 586 and test signal TE, and generates signal ZDL0. Inverter 595 inverts signal ZDL0 to generate signal DL0. NOR gate 591 receives an output signal of NAND gate 587 and test signal TE, and generates signal ZDL1. Inverter 596 inverts signal ZDL1 to generate signal DL1.

NOR gate 592 receives an output signal of NAND gate 588 and test signal TE, and generates signal ZDL2. Inverter 597 inverts signal ZDL2 to generate signal DL2. NOR gate 593 receives an output signal of NAND gate 589 and test signal TE, and generates signal ZDL3. Inverter 598 inverts signal ZDL3 to generate signal DL3.

NAND gate 594 receives test signal TE and signal $\phi 1$, and generates signal DLT. Inverter 599 inverts signal DLT to generate signal ZDLT.

Figure 23:
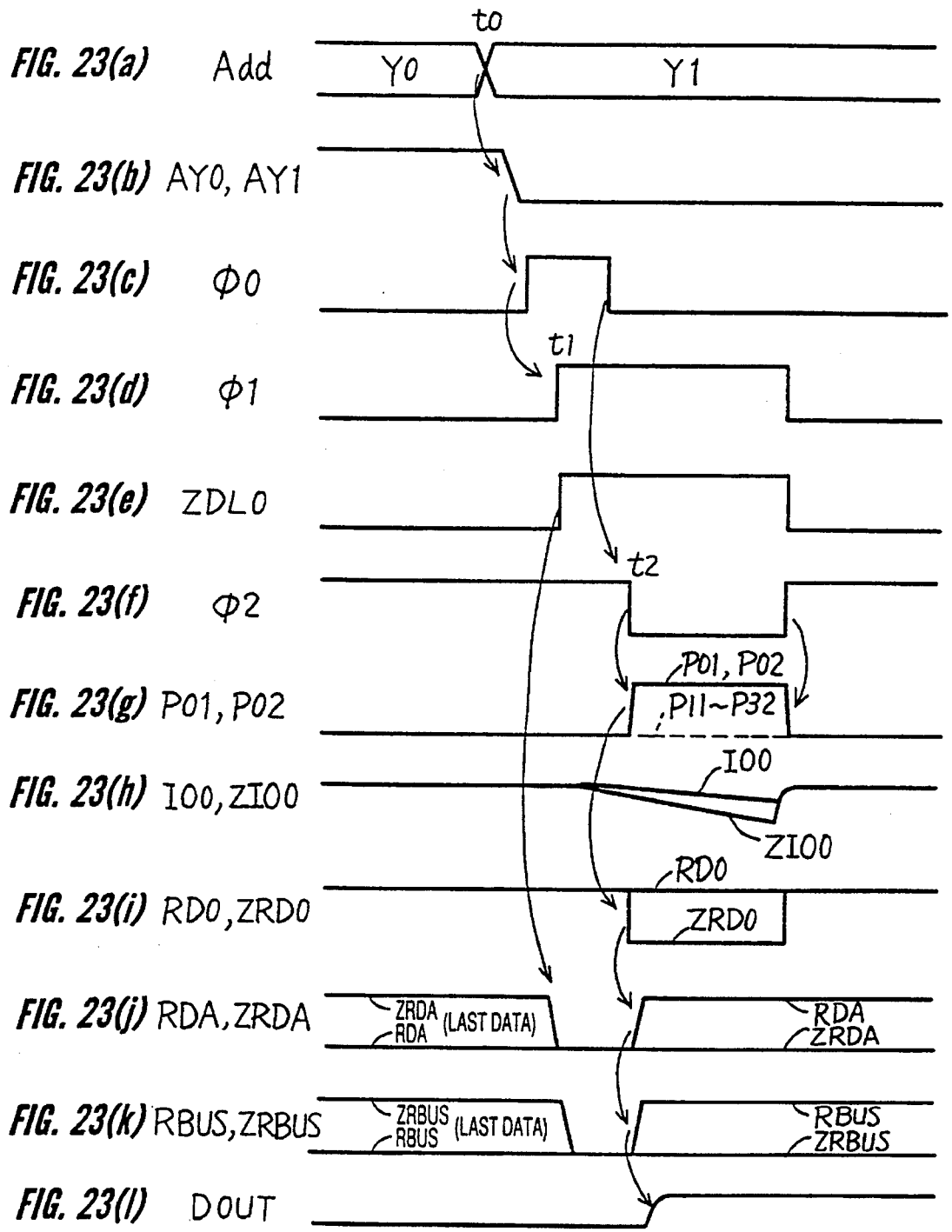
FIG. 23 is a timing chart showing the operation in a normal read mode of the data read circuit shown in FIG. 20.

The operation of the data read circuit in FIG. 20 will be described below. The data read circuit can operate selectively in the normal read mode for performing the normal read operation and the test mode for performing the operation test. First, the operation in the normal read mode will be described below. FIG. 23 is a timing chart showing the operation of the data read circuit in the normal read mode.

Referring to FIG. 23, test signal TE is low in the normal read mode. At time t0, external address signal Add changes from Y0 to Y1, so that signal $\phi 0$ generates. In response to signal $\phi 0$, signal $\phi 1$ becomes high at time t1, so that signal DL0 becomes low and signal ZDL0 becomes high.

Therefore, CMOS transfer gate 524 becomes conductive, and signals ZRDA and RDA sent from data latch circuits 540a and 540b are reset to the low level. In response to this, signals RBUS and ZRBUS on the read data buses are reset to the low level.

In response to the fall of signal $\phi 0$, signal $\phi 2$ becomes low at time t2. If both of two bits AY0 and AY1 of the internal Y-address signal are low with respect to Y1 of the external address signal, only signals P01 and P02 among signals P01–P32 become high as a result of decoding of signal $\phi 2$ in control signal generating circuit 500 in FIG. 21.

Thereby, each of transistors 502, 503, 504 and 505 in FIG. 20 becomes conductive, so that I/O line pair IO0 and ZIO0 is connected to differential amplifier circuits 520 and 521. As a result, differential amplifier circuits 521 and 520 amplify the potential difference of I/O line pair IO0 and ZIO, and supply signals RD0 and ZRD0 therefrom.

Signals RD0 and ZRD0 are supplied to data latch circuits 540a and 540b via CMOS transfer gates 525 and 524, respectively. Read data is driven by read data bus driver circuit 545 onto read data buses RBUS and ZRBUS and is transmitted to output buffer 47. Thereby, the external output signal is supplied to external output terminal DOUT.

Meanwhile, in the case where the read data is to be read from I/O line pair IO1 and ZIO1, signals P11 and P12 become high, so that I/O line pair IO1 and ZIO1 is connected to differential amplifier circuits 520 and 521.

The read data amplified by differential amplifier circuits 521 and 520 is transmitted to output buffer 47 via CMOS transfer gates 525 and 524, data latch circuits 540a and 540b, read data bus driver circuit 545 and read data buses ZRBUS and RBUS, and the external output data signal is supplied from output buffer 47 to output terminal DOUT.

In the data read circuit in FIG. 20, since two I/O line pairs commonly use two differential amplifier circuits, the differential amplifier circuits in the data read circuit can be reduced in number.

Figure 24:
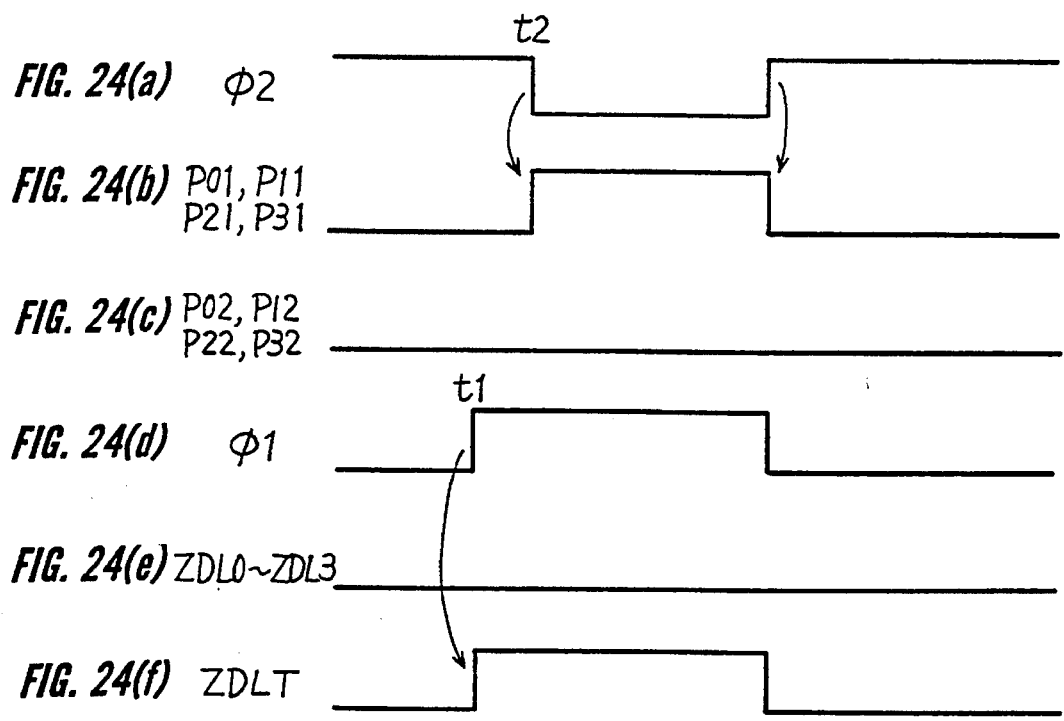
FIG. 24 is a timing chart showing the operation in a test mode of the data read circuit in FIG. 20.

Then, the operation in the test mode of the data read circuit in FIG. 20 will be described below. FIG. 24 is a timing chart showing the operation in the test mode of the data read circuit.

The following description will be given on the case where the test is performed to determine whether the data at the high level can be written/read correctly or not, and for this purpose, four bits are collectively and simultaneously tested by obtaining the logical product of read data on four I/O line pairs IO0, ZIO0–IO3, ZIO3.

Referring to FIG. 24, when signal $\phi2$ becomes low at time t2, signals P02, P12, P22 and P32 become low and signals P01, P11, P21 and P31 become high, because test signal TE is high.

Thereby, four I/O line pairs IO0, ZIO0–IO3, ZIO3 each are connected to one of differential amplifier circuits 520–523. Thus, the read operation in the test mode is performed in such a manner that one read data is amplified by one differential amplifier circuit, and logical product of four results of amplification is obtained.

At time t1, signal $\phi1$ becomes high, so that signal DLT becomes low in the control signal generating circuit 501 shown in FIG. 22, and thus signal ZDLT becomes high. Thereby, CMOS transfer gates 532 and 533 become conductive, and thus the output signal of NAND gate 530 producing the logical product is applies to the respective differential amplifier circuits 540a and 540b.

All data at the high level written into the respective memory cells are read onto four I/O line pairs IO0, ZIO0–IO3, ZIO3, and it is tested whether the four data are at the high level or not.

If the data at the high level has been written correctly into each memory cell, differential amplifier circuits 520–523 generate such output signals that signals ZRD0 and ZRD1 are low and signals RD0 and RD1 are high. Thereby, NAND gate 530 produces the output signal at the low level. Consequently, signal RDA supplied from data latch circuit 540a becomes high, and signal ZRDA supplied from data latch circuit 540b becomes low.

In response to them, data at the high level is sent to external output terminal DOUT, and a flag indicative of correct reading is set. If read error has occurred, NAND gate 530 supplies the output signal at the high level when at least one data at the low level is read, so that signal RDA becomes low, and signal ZRDA becomes high. In response to them, data at the low level is supplied to external output terminal DOUT, and a flag indicative of the read error is set.

In the data read circuit in FIG. 20, differential amplifier circuits 520–523 operate in a complementary manner, so that it is not necessary to delay the operation timing of read data bus driver circuit 545. Therefore, the speed of address access can be increased. Further, in the test mode, the number of degenerate bits can be twice as large as that in the ordinary read operation.

Although all the embodiments described above are related to the data bus structure in the semiconductor memory device, the invention may be applied to other structures or circuitry such as a microprocessor, which includes a kind of register circuit capable of holding data as well as a data bus transferring the data read therefrom to another logical circuit.

Fifth Embodiment

A fifth embodiment will now be described below. This fifth embodiment will be described as another example of the structure wherein signals of a small amplitude are transferred through the read data buses as already described in connection with the third embodiment. More specifically, the description will be given on a level shifting circuit capably of reducing a through current which flows when shifting the level of the signal.

Figure 25:
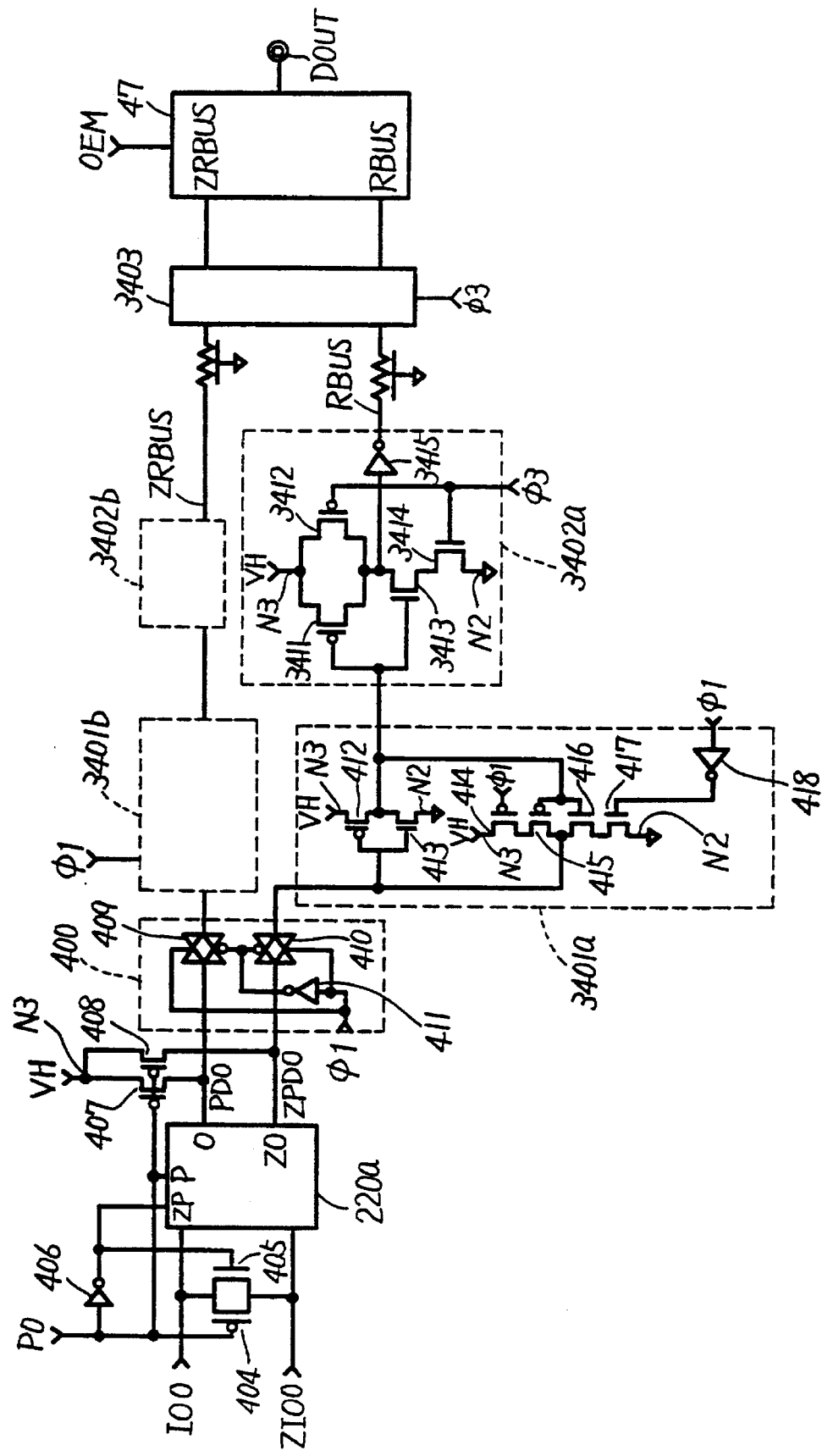
FIG. 25 is a circuit diagram of a data read circuit in a semiconductor memory device of a fifth embodiment.

FIG. 25 is a circuit diagram of a data read circuit in the semiconductor memory device of the fifth embodiment. In the data read circuit in FIG. 25, the same portions as those in FIG. 17 bear the same reference numbers, and will not be described below.

The data read circuit in FIG. 25 differs from that in FIG. 17 in that the low level of the signal sent from differential amplifier circuit 220a to a level shifting circuit 3403 is equal to the ground potential and thus is not equal to the potential VL in FIG. 17. The difference will be described below in greater detail.

Complementary signal lines arranged between differential amplifier circuit 220a and selector circuit 400 transmit signals, of which high level is equal to the potential VH, and of which low level is equal to the ground potential (0 V). Thus, signals having such a small amplitude are applied through selector circuit 400 to data latch circuits 3401a and 3401b.

The signals having such a small amplitude are transmitted through data latch circuits 3401a and 3401b as well as read data bus driver circuits 3402a and 3402b to read data buses RBUS and ZRBUS. Therefore, data latch circuits 3401a and 3401b and read data bus driver circuits 3402a and 3402b each receive the ground potential (0 V) as the potential at the low level.

Description will be given more specifically. In data latch circuit 3401a, each of transistors 413 and 417 is connected to ground node N2. A similar connection is employed also in data latch circuit 3402b.

Read data bus driver circuits 3402a and 3402b are different from read data bus driver circuits 402a and 402b in FIG. 17, and have the same structures as those shown in FIG. 14.

Each of read data bus driver circuits 3402a and 3402b includes PMOS transistors 3411 and 3412, NMOS transistors 3413 and 3414, and an inverter 3415. Transistors 3411–3415 form an NAND gate.

Read data bus driver circuits 3402a and 3402b have such a distinctive feature that they receive the potential VH as the potential a the high level and receive the ground potential (0 V) as the potential at the low level. Therefore, read data bus driver circuits 3402a and 3402b transmit signals of the amplitude between 0 V and VH to read data buses RBUS and ZRBUS.

The most distinctive feature in the circuit shown in FIG. 25 is a level shifting circuit 3403.

For example, the level shifting circuit shown in FIG. 18 has a well-known structure. This know level shifting circuit, however, has such a disadvantage that a large through current flows during the level shifting operation. This disadvantage will be described below.

Referring to FIG. 18, when the level of signal RBUS changes from the low level to the high level in accordance with the change from potential VL to potential VH, transistor 423 is turned on. Transistor 424 is turned off when it receives on its gate an output signal of the inverter formed of transistors 425 and 426.

Therefore, transistor 424 is turned off with a delay by one step from the turn-on of transistor 423. Therefore, both transistors 423 and 424 concurrently maintain the on-state for a period which corresponds to one stage of gate of the inverter. When the transistors 423 and 424 concurrently maintain the on-state, a through current flows in the circuit.

Figure 26:
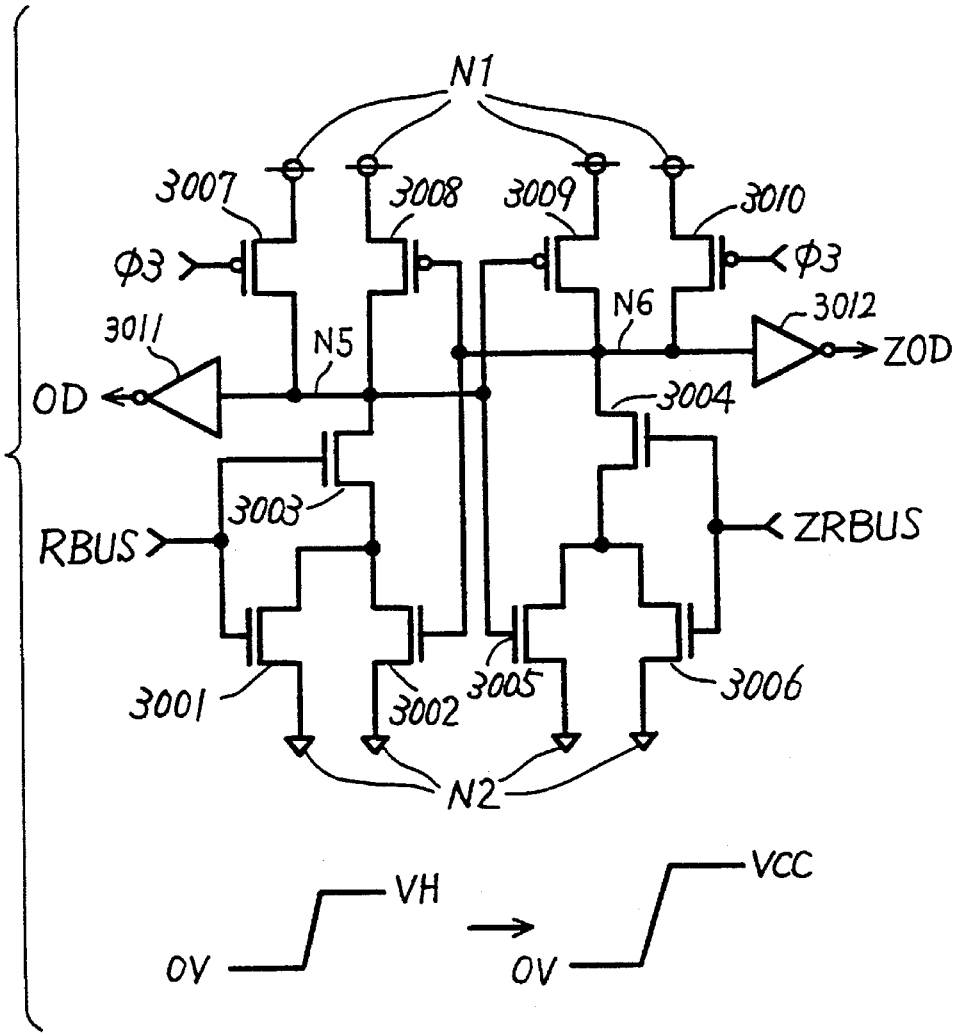
FIG. 26 is a circuit diagram showing a structure of a level shifting circuit shown in FIG. 25.

Then, level shifting circuit 3403 will be described below. Level shifting circuit 3403 can suppress the through current as already described. FIG. 26 is a circuit diagram showing a structure of the level shifting circuit in FIG. 25.

Referring to FIG. 26, the level shifting circuit includes NMOS transistors 3001–3006, PMOS transistors 3007–3010 and inverters 3011–3012.

Inverters 3011 and 3012 receive power supply voltage VCC for their operation. Inverter 3011 inverts a level of potential of a node N5 for outputting the same. Inverter 3012 inverts a level of potential of a node N6 for outputting the same.

Transistors 3007 and 3008 are connected in parallel between power supply node N1 and node N5. Transistors 3003 and 3001 are connected in serial between node N5 and ground node N2. Transistor 3002 is connected in parallel to transistor 3001.

Transistors 3009 and 3010 are connected in parallel between power supply node N1 and node N6. Transistors 3004 and 3005 are connected in serial between node N6 and ground node N2. Transistor 3006 is connected in parallel to transistor 3005.

Each of transistors 3001 and 3003 receives signal RBUS on its gate. Each of transistors 3005 and 3006 receives signal ZRBUS on its gate. Each of transistors 3007 and 3010 receives signal φ3 on its gate. Signal φ3 is supplied from the control signal generating circuit in FIG. 8. Each of transistors 3002 and 3008 has a gate connected to node N6. Each of transistors 3005 and 3009 has a gate connected to node N5.

Figure 27:
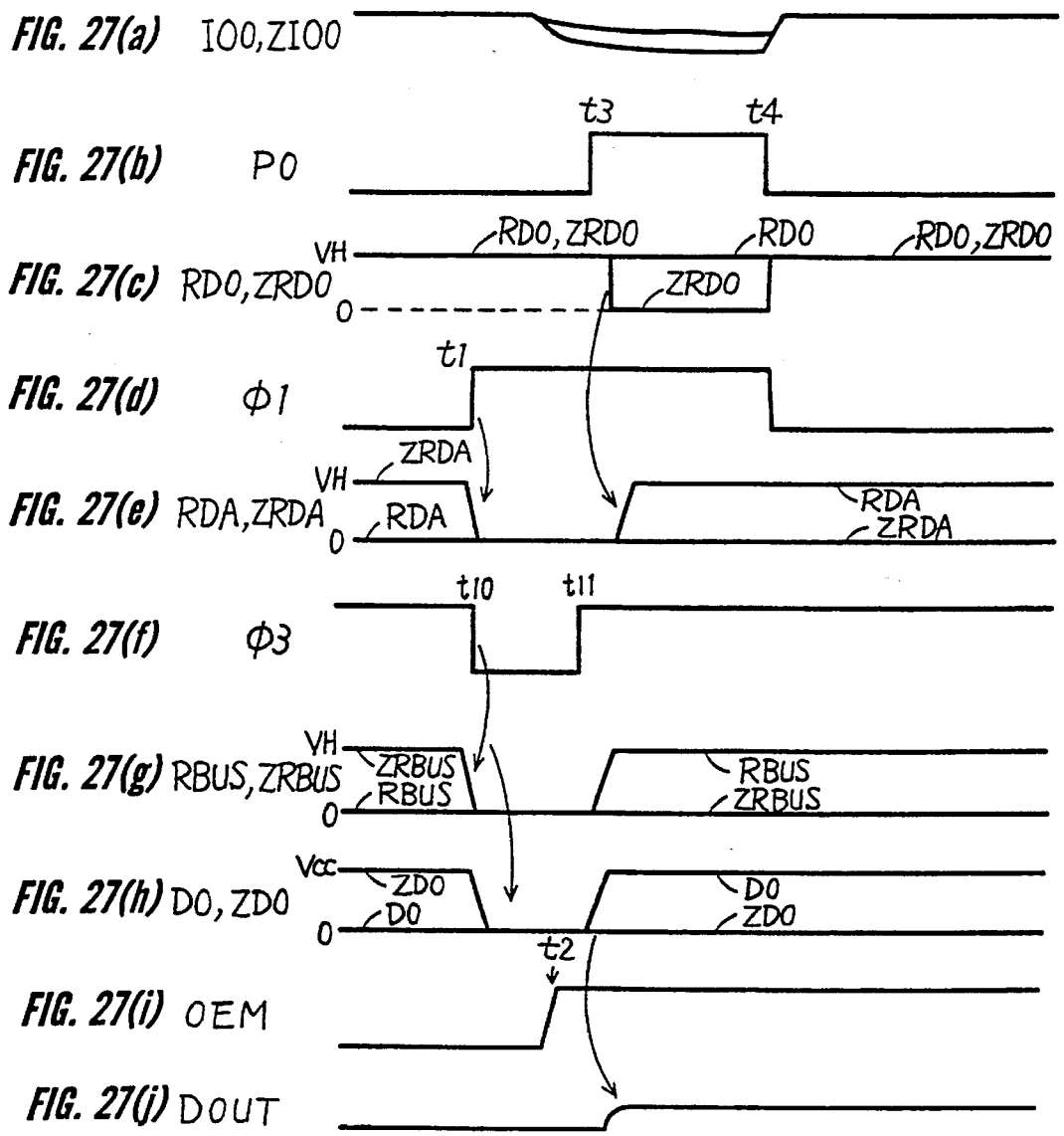
FIG. 27 is a timing chart showing the operation of the data read circuit in FIG. 25.

Now, the operation of the level shifting circuit in FIG. 26 will be described below. FIG. 27 is a timing chart showing the operation of the data read circuit shown in FIG. 26. The portions in FIG. 27 which perform the same operation as those in FIG. 19 will not be described below.

In order to reset the last read date which has been driven onto data buses RBUS AND ZRBUS, signal φ3 falls from high to low at time t10. When signal φ3 becomes low, both signals RBUS and ZRBUS supplied from read data bus driver circuits 3402a and 3402b become low.

Simultaneously with the above, both transistors 3003 and 3004 are turned off, and both transistors 3007 and 3010 receiving signals φ3 on their gates are turned on. Thereby, resetting is performed so that both output signals OD and ZOD of the level shifting circuit may attain the low level of 0 V.

At time t11 before the output of read data from differential amplifier circuit 220a, signal φ3 attains the high level. Thereafter, read data buses RBUS and ZRBUS receive the read data having a small voltage amplitude of 0–VH. Such a small amplitude is changed by level shifting circuit 3403 into a large voltage amplitude of 0–VCC.

In the above operation, the timing of generation of signal φ3 and the timing of transmission of data onto read data buses RBUS and ZRBUS are the completely same as those shown in the timing chart of FIG. 15. Signals RD0 and ZRD0 as well as signals RDA and ZRDA in FIG. 27 are different from those in FIG. 17 in that the low level thereof is not equal to VL but equal to 0.

After the reset state where signals RBUS and ZRBUS are maintained at 0V, the read data described above is driven to read data buses RBUS and ZRBUS, so that one of the read data buses attains the potential VH. The following description will be given on the case where signals RBUS and ZRBUS attain the potential VH and 0 V, respectively, and the data at the high level is transmitted to read data buses RBUS and ZRBUS.

In the reset state, gates of both transistors 3003 and 3004 maintain the potential of 0 V, so that these transistors are off. Therefore, while signal φ3 is at the low level, transistors 3007 and 3010 are on, so that nodes N5 and N6 are precharged to the high level.

After signal φ3 attained the high level, and transistors 3007 and 3010 were turned on, signal RBUS attains the potential VH. Thereby, transistors 3001 and 3003 are turned on. In this case, since the potential of signal ZRBUS is 0 V, transistors 3004 and 3006 are off.

Referring to FIG. 26, the inverter, which is formed of transistors 3008, 3003, 3001 and 3002, and inverter, which is formed of transistors 3009, 3004, 3005 and 3006, have input terminals connected together and also have output terminals connected together, so that they may be deemed to be a kind of latch circuit. In this case, however, transistors 3004 and 3006 are off, so that such a latch circuit is not actually formed.

In this case, therefore, the potential of node N5 precharged to the high level is rapidly reduced to the low level through transistors 3003 and 3001. As the potential of node N5 is reduced toward the low level, transistor 3009 starts to be turned on. Thereby, the potential of node N6 is fixed at the high level.

Therefore, transistor 3002 which receives on its gate the potential of node N6 is strongly turned on. This results in a kind of positive feedback phenomenon in which the low level of the potential of node N5 is further reduced.

The data read circuit provided with level shifting circuit 3403 shown in FIG. 26 operates as described above, and the level shifting circuit 3403 operates in such a manner that the transistors supplying the low level operate synchronously with each other, so that the through current during the operation of the level shifting circuit can be reduced, and the speed of the level shifting operation can be increased.

Figure 28:
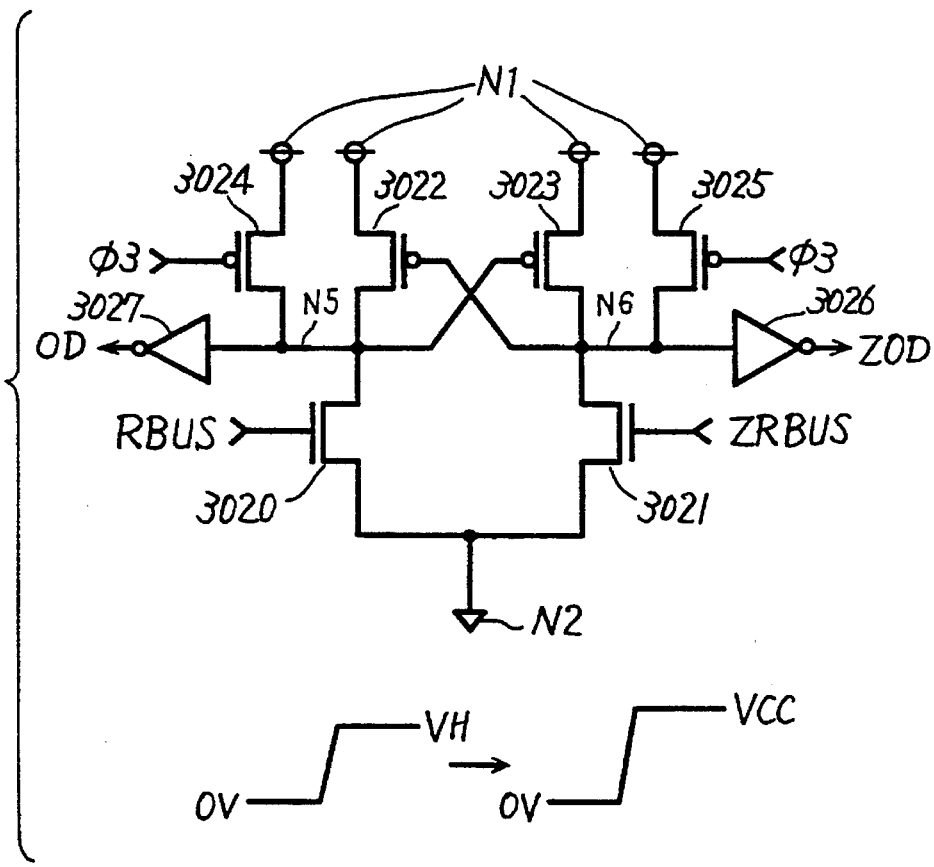
FIG. 28 is a circuit diagram showing a modification of the level shifting circuit in FIG. 26.
Figure 29:
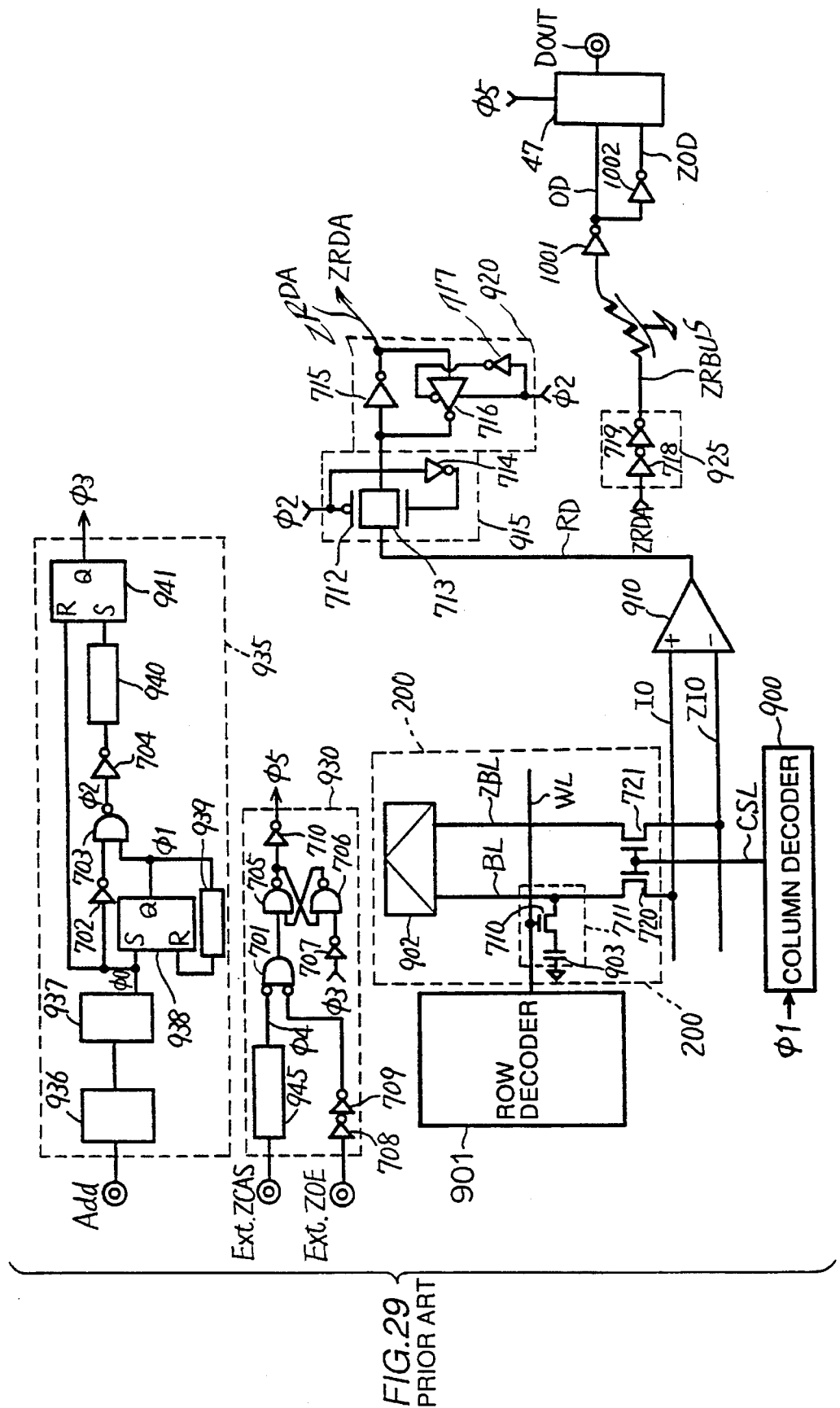
FIG. 29 is a circuit diagram of a data read circuit in a conventional semiconductor memory device.

A modification of the level shifting circuit shown in FIG. 26 will be described below. FIG. 28 is a circuit diagram showing the modification of the level shifting circuit in FIG. 26.

Referring to FIG. 28, the level shifting circuit includes NMOS transistors 3020 and 3021, PMOS transistors 3024 and 3025, and inverters 3026 and 3027. The level shifting circuit in FIG. 28 have the structure similar to that shown in FIG. 26 but does not employ transistors 3001, 3002, 3005 and 3006 in FIG. 26.

Therefore, the level shifting circuit in FIG. 28 operates similarly to that in FIG. 26. Therefore, the operation will not be described below. Since the operation is similar to that of the level shifting operation in FIG. 26, the level shifting circuit in FIG. 28 operates in a manner similar to that shown in the timing chart of FIG. 27.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a memory cell array including a plurality of word lines, a plurality of bit line pairs crossing said plurality of word lines, and a plurality of memory cells connected to said word lines and said bit line pairs;

a plurality of I/O line pairs connected to said plurality of bit line pairs via switching means;

a plurality of differential amplifier means provided correspondingly to said plurality of I/O line pairs, said differential amplifier means being selectively operated to amplify a potential difference of the corresponding I/O line pair and output the same to a data line pair, said data line pair having first and second data lines for complementarily transmitting the output signal of said selected differential amplifier means;

first drive means for receiving said output signal of said selected differential amplifier means and transmitting a signal having the same phase as said received output signal to said first data line in response to said received output signal;

second drive means for receiving a signal having a phase opposite to that of said output signal of said selected differential amplifier means and transmitting a signal, which has the phase opposite to that of said output signal, to said second data line in response to said signal having said opposite phase;

output buffer means for receiving signals from said first and second data line, providing an output signal to an output pad and being controlled to attain one of a high impedance state and a signal output state in response to the potentials of said signals received from said first and second data lines; and control means for controlling said first and second drive means such that potentials of said first and second data lines attain levels which set said output buffer means to said high impedance state prior to the operation of said selected differential amplifier means, wherein said plurality of differential amplifier means are positioned close to the memory cell array as compared with the output buffer means which is positioned close to the output pad.

2. The semiconductor memory device according to claim 1, wherein each of said first and second data lines selectively attains states of first and second potentials at different levels in response to the signal transmitted therethrough; and said output buffer means is responsive to the signals, which are supplied from said first and second data lines, to be driven to attain selectively, a first operation state for attaining the high impedance state, when said first and second data lines have the same potential, a second operation state for outputting data of a first polarity, when said first data line has said first potential and said second data line has said second potential, and a third operation state for outputting data of a second polarity different from said first polarity, when said first data line has said second potential and said second data line has said first potential.

3. The semiconductor memory device according to claim 1, wherein said control means receives an external address signal for selecting said memory cell in said memory cell array, and generates a control signal for activating said first and second drive means in response to change of an address indicated by said external address signal;

said first drive means includes, first logic means for receiving the output signal supplied selectively from said plurality of differential amplifier means and said control signal, and transmitting a signal of the same phase as said output signal to said first data line in response to logic of the received signals; and said second drive means includes, second logic means for receiving a signal of a phase opposite to that of output signal supplied selectively from said plurality of differential amplifier means and said control signal, and transmitting a signal of a phase opposite to that of said output signal to said second data line in response to logic of the received signals.

4. The semiconductor memory device according to claim 1, wherein said memory cell array, said plurality of I/O line pairs, said plurality of differential amplifier means, said first and second data lines, said first and second drive means, said output buffer means and said control means are formed on a semiconductor substrate, and at least said plurality of I/O line pairs, said plurality of differential amplifier means, said first drive means and said second drive means are disposed near said memory cell array.

5. The semiconductor memory device according to claim 1, further comprising:

latch means for receiving the output signal of said selected differential amplifier means and inverting the received signal to supply the same to said second drive means.

6. The semiconductor memory device according to claim 5, further comprising:

signal generating means for generating a control signal, in response to change of an address indicated by an external address signal used for selecting said memory cell in said memory cell array; and a plurality of transfer gate means provided correspondingly to said plurality of differential amplifier means, respectively, said plurality of transfer gate means being selectively operated in response to said control signal to perform an operation for transmitting the output signal of the corresponding selected differential amplifier means to said first drive means and said latch means.

7. A semiconductor memory device comprising:

a memory cell array including a plurality of word lines, a plurality of bit line pairs crossing said plurality of word lines, and a plurality of memory cells connected to said word lines and said bit line pairs;

a plurality of I/O line pairs connected to said plurality of bit line pairs via switching means;

a plurality of differential amplifier means provided correspondingly to said plurality of I/O line pairs, said plurality of differential amplifier means being selectively operated to amplify a potential difference of said corresponding I/O line pair to output, as a result of the amplification, first and second output signals which are complementary to each other;

a first data line selectively connected to said selected differential amplifier means for transmitting said first output signal;

a second data line selectively connected to said selected differential amplifier means for transmitting said second output signal;

first drive means for transmitting said first output signal of said selected differential amplifier means to said first data line;

second drive means for transmitting said second output signal of said selected differential amplifier means to said second data line; and output buffer means for receiving the signals from said first and second data lines, providing an output signal to an output pad and being controlled in response to potentials of said received signals to attain one of a high impedance state and a signal output state, wherein said first and second drive means transmit signals of potentials, which set said output buffer means to the high impedance state prior to operation of said selected differential amplifier means, to said first and second data lines, wherein said plurality of differential amplifier means are positioned close to the memory cell array as compared with the output buffer means which is positioned close to the output pad.

8. The semiconductor memory device according to claim 7, wherein said first drive means is driven only in response to said first output signal received from said first data line, and said second drive means is driven only in response to said second output signal received from said second data line.

9. The semiconductor memory device according to claim 7, wherein each of said first and second data lines selectively attains states of first and second potentials at different levels in response to the signal transmitted therethrough; and said output buffer means is responsive to the signals, which are supplied from said first and second data lines, to be driven to attain selectively, a first operation state for attaining the high impedance state, when said first and second data lines have the same potential, a second operation state for outputting data of a first polarity, when said first data line has said first potential and said second data line has said second potential, and a third operation state for outputting data of a second polarity different from said first polarity, when said first data line has said second potential and said second data line has said first potential.

10. The semiconductor memory device according to claim 7, wherein each of said first and second output signals supplied from said differential amplifier means has a high level at the first potential or a low level at the second potential;

said semiconductor memory device further comprises level shifting means for shifting the potential of each of said first and second data lines and supplying each of shifted potentials to said output buffer means;

said level shifting means is operable to shift the potential of each of said first and second data lines such that said first potential shifts to a higher third potential and said second potential shifts to a lower fourth potential; and said output buffer means has its state controlled in response to the respective potentials supplied from said level shifting means.

11. The semiconductor memory device according to claim 10, wherein said output buffer means is responsive to the signals, which are received from said level shifting means, to be driven to attain selectively, a first operation state for attaining the high impedance state, when the potentials of said first and second data lines shifted by said level shifting means are equal to each other, a second operation state for outputting data of a first polarity, when the potential of said first data line shifted by said level shifting means is said third potential and the potential of said second data line shifted by said level shifting means is said fourth potential, and a third operation state for outputting data of a second polarity different from said first polarity, when the potential of said first data line shifted by said level shifting means is said fourth potential and the potential of said second data line shifted by said level shifting means is said third potential.

12. The semiconductor memory device according to claim 10, wherein said level shifting means includes:

a power supply node receiving a power supply potential;

a ground node receiving a ground potential;

first and second nodes outputting signals at the shifted levels;

precharge means for precharging said first and second nodes to an equal potential;

a first transistor of a first conductivity type which has a gate receiving the potential of said first data line and is responsive to the received potential to supply the ground potential to said first node;

a second transistor of the first conductivity type which has a gate receiving the potential of said second data line and is responsive to the received potential to supply said ground potential to said second node;

a third transistor of a second conductivity type which has a gate receiving the potential of said first node and is responsive to the received potential to supply said power supply potential to said second node;

a fourth transistor of the second conductivity type which has a gate receiving the potential of said second node and is responsive to the received potential to supply said power supply potential to said first node;

first inverter means for inverting the potential of said first node and outputting the same; and second inverter means for inverting the potential of said second node and outputting the same.

13. The semiconductor memory device according to claim 7, further comprising:

first latch means for receiving the first output signal of said selected differential amplifier means and inverting the received signal to supply the same to said first drive means and to latch the same; and second latch means for receiving the second output signal of said selected differential amplifier means and inverting the received signal to supply the same to said second drive means and to latch the same.

14. The semiconductor memory device according to claim 13, further comprising:

signal generating means for generating a control signal, which is used for supplying the output signal of said selected differential amplifier means to said first and second latch means, in response to change of an address indicated by an external address signal which is used for selecting said memory cell in said memory cell array; and a plurality of transfer gate means provided correspondingly to said plurality of differential amplifier means, respectively, said plurality of transfer gate means being selectively operated in response to said control signal to perform an operation for transmitting the first and second output signals of the corresponding selected differential amplifier means to said first and second latch means, respectively.

15. The semiconductor memory device according to claim 7, wherein each of said plurality of differential amplifier means is provided correspondingly to two I/O line pairs among said plurality of I/O line pairs, and includes two differential amplifier elements each having a pair of input terminals and one output terminal;

said semiconductor memory device further comprises:

a plurality of switching means, each of which is provided correspondingly to said two I/O line pairs, and is operable to switch a connection state between said two pairs of I/O line pairs and said two differential amplifier elements in the corresponding differential amplifier means in accordance with the operation mode, each of said switching means is operable to connect one of said corresponding two I/O line pairs to each of said two differential amplifier elements in a normal operation mode, and is operable to connect said corresponding two I/O line pairs to said two differential amplifier elements in the one-to-one corresponding relationship in a test mode; and logic means for outputting a signal indicative of a result of test based on the respective output signals of said plurality of differential amplifier means in said test mode.

16. A semiconductor memory device comprising:

a memory cell array including a plurality of word lines, a plurality of bit line pairs crossing said plurality of word lines, and a plurality of memory cells connected to said word lines and said bit line pairs;

a plurality of I/O line pairs connected to said plurality of bit line pairs via switching means; and a plurality of differential amplifier means provided correspondingly to said plurality of I/O line pairs, respectively, said plurality of differential amplifier means being selectively operated, and each being operable to amplify a potential difference of said corresponding I/O line pair to output, as a result of the amplification, first and second output signals which are complementary to each other, wherein each of said plurality of differential amplifier means includes CMOS differential amplifier means;

said CMOS differential amplifier means includes, a first drive MOS transistor of a first conductivity type which receives on its gate a first input signal supplied from one I/O line in said corresponding I/O line pair, a second drive MOS transistor of the first conductivity type which receives on its gate a second input signal supplied from the other I/O line in said corresponding I/O line pair, first and second load MOS transistors of a second conductivity type, each of which has a drain connected to a drain of said first drive MOS transistor, third and fourth load MOS transistors of the second conductivity type, each of which has a drain connected to a drain of said second load MOS transistor, a third drive MOS transistor of the first conductivity type receiving on its gate said second input signal, a fifth load MOS transistor of the second conductivity type having a drain connected to a drain of said third drive MOS transistor, a fourth drive MOS transistor of the first conductivity type receiving on its gate said first input signal, and a sixth load MOS transistor of the second conductivity type having a drain connected to the drain of said fourth drive MOS transistor;

each of said first, third and fifth load MOS transistors has a gate connected to the drain of said first drive MOS transistor, and each of said second, fourth and sixth load MOS transistors has a gate connected to the drain of said second drive MOS transistor; and said first output signal is output from a connection node of the drains of said third drive MOS transistor and said fifth load MOS transistor, and said second output signal is output from a connection node of the drains of said fourth load MOS transistor and said sixth load MOS transistor.

17. A semiconductor memory device comprising:

a memory cell array including a plurality of word lines, a plurality of bit line pairs crossing said plurality of word lines, and a plurality of memory cells connected to said word lines and said bit line pairs;

a plurality of I/O line pairs connected to said plurality of bit line pairs via switching means;

a plurality of differential amplifier means provided correspondingly to said plurality of I/O line pairs, each differential amplifier means being selectively operated to amplify a potential difference of the corresponding I/O line pair and provide a data signal and a complementary data signal;

a data line pair having first and second data lines for transmitting the data signal and complementary data signal of the selected differential amplifier means;

first drive means for receiving the data signal of said selected differential amplifier means and transmitting a signal having the same phase as said data signal to said first data line;

second drive means for receiving the complementary data signal of said selected differential amplifier means and transmitting a signal having the same phase as said complementary data signal to said second data line;

output buffer means for receiving the signals from the first and second data lines, providing an output data signal to an output pad and being controlled to attain one of a high impedance state and a signal output state in response to the potentials of said signals received from the first and second data lines; and control means for controlling the first and second drive means such that potentials of the first and second data lines attain levels which set the output buffer means to said high impedance state prior to the operation of the selected differential amplifier means, wherein the output buffer means is directly driven by the data signal and complementary data signal from a corresponding differential amplifier means, and the plurality of differential amplifier means are positioned close to the memory cell array as compared with the output buffer means which is positioned close to the output pad.

* * * * *